United States Patent
Lin et al.

(10) Patent No.: US 10,763,363 B2
(45) Date of Patent: Sep. 1, 2020

(54) GRADIENT DOPED REGION OF RECESSED FIN FORMING A FINFET DEVICE

(71) Applicant: Taiwan Semiconductor Manufacturing Co., Ltd., Hsinchu (TW)

(72) Inventors: Jyun-Hao Lin, Tainan (TW); Chun-Feng Nieh, Hsinchu (TW); Huicheng Chang, Tainan (TW); Yu-Chang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/949,273

(22) Filed: Apr. 10, 2018

(65) Prior Publication Data

US 2019/0312143 A1    Oct. 10, 2019

(51) Int. Cl.

| H01L 29/78 | (2006.01) |
|---|---|
| H01L 29/10 | (2006.01) |
| H01L 29/66 | (2006.01) |
| H01L 29/08 | (2006.01) |
| H01L 29/167 | (2006.01) |
| H01L 29/36 | (2006.01) |
| H01L 21/265 | (2006.01) |
| H01L 29/165 | (2006.01) |
| H01L 27/092 | (2006.01) |
| H01L 21/8238 | (2006.01) |
| H01L 21/02 | (2006.01) |
| H01L 27/11 | (2006.01) |
| H01L 21/306 | (2006.01) |

(52) U.S. Cl.
CPC .... *H01L 29/7848* (2013.01); *H01L 21/02532* (2013.01); *H01L 21/26513* (2013.01); *H01L 21/823814* (2013.01); *H01L 21/823821* (2013.01); *H01L 27/0924* (2013.01); *H01L 29/0847* (2013.01); *H01L 29/105* (2013.01); *H01L 29/165* (2013.01); *H01L 29/167* (2013.01); *H01L 29/36* (2013.01); *H01L 29/66636* (2013.01); *H01L 29/66795* (2013.01); *H01L 29/7851* (2013.01); *H01L 21/26586* (2013.01); *H01L 21/30604* (2013.01); *H01L 21/823828* (2013.01); *H01L 21/823864* (2013.01); *H01L 27/1104* (2013.01); *H01L 29/6656* (2013.01); *H01L 29/66545* (2013.01)

(58) Field of Classification Search
CPC .......... H01L 29/7848; H01L 21/02532; H01L 21/26513
See application file for complete search history.

(56) References Cited

U.S. PATENT DOCUMENTS 9,093,477 B1 * 7/2015 Lin ................ H01L 21/26586
9,093,530 B2    7/2015 Huang et al.
(Continued)

*Primary Examiner* — Errol V Fernandes
(74) *Attorney, Agent, or Firm* — Slater Matsil, LLP

(57) ABSTRACT

An embodiment is a method of manufacturing a semiconductor device. The method includes forming a fin on a substrate. A gate structure is formed over the fin. A recess is formed in the fin proximate the gate structure. A gradient doped region is formed in the fin with a p-type dopant. The gradient doped region extends from a bottom surface of the recess to a vertical depth below the recess in the fin. A source/drain region is formed in the recess and on the gradient doped regions.

20 Claims, 19 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,043,718 B1 * | 8/2018 | Chen ................. H01L 29/66636 |
| 2014/0252475 A1 | 9/2014 | Xu |
| 2015/0091099 A1 | 4/2015 | Ching et al. |
| 2016/0043190 A1 * | 2/2016 | Banghart .............. H01L 29/785 257/401 |
| 2017/0154990 A1 | 6/2017 | Sung et al. |
| 2018/0108742 A1 * | 4/2018 | Chang .................... H01L 29/36 |
| 2018/0374759 A1 * | 12/2018 | Holt ................ H01L 21/823814 |

\* cited by examiner

GRADIENT DOPED REGION OF RECESSED FIN FORMING A FINFET DEVICE

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is a replacement-gate process (also called as a "gate-last" process) in which the final gate stack is fabricated "last". However, there are challenges to implement such IC fabrication processes in advanced process nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
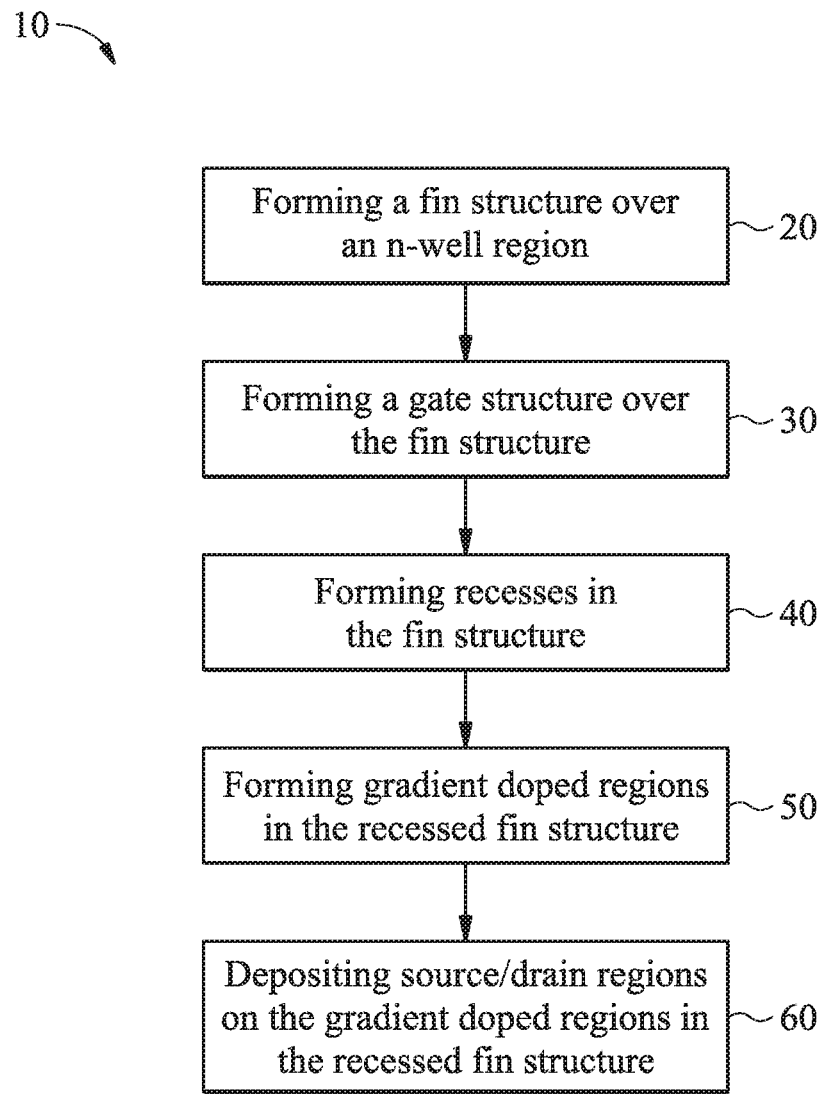
FIG. 1 is a flow diagram illustrating a method of manufacturing a semiconductor device, such as a FinFET structure, on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to forming a gradient doped region in a fin structure, such as along a surface (e.g., a bottom surface) of a recess to form a source/drain structure of a p-type strained channel device. In certain embodiments, the gradient doped regions can help to reduce a channel resistance and a parasitic resistance of a p-type strained channel device. In certain embodiments, lower channel resistance Rch and/or lower parasitic resistance Rp help to reduce or prevent latch-up issues of complementary metal-oxide-semiconductor devices.

FIG. 1 is a flow diagram illustrating a method 10 of manufacturing a semiconductor device, such as a FinFET structure, on a substrate, in accordance with some embodiments. More details of the method 10 is described in reference to FIG. 2 to FIG. 7, which are schematic diagrams of various stages of manufacturing a semiconductor structure 100, such as FinFET semiconductor devices, on a substrate 102, in accordance with some embodiments.

Figure 2:
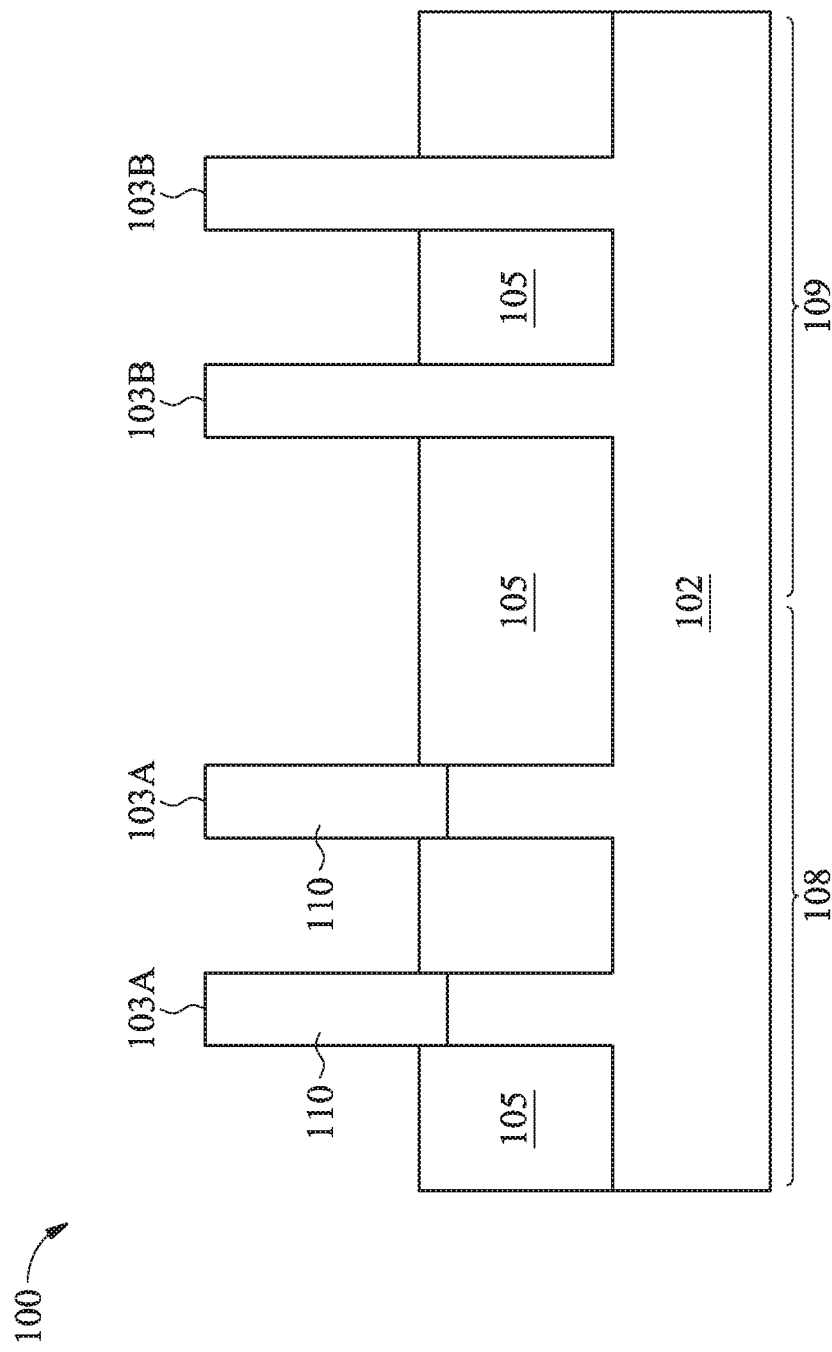
FIGS. 2, 3B-3C, 4, 5A-5B, 6A-6B, and 7 illustrate cross-sectional views of intermediate structures of a semiconductor device at intermediate stages of manufacturing the semiconductor device, in accordance with some embodiments.

FIG. 2 is a cross-sectional view of the substrate 102. The substrate 102 may be a semiconductor wafer, such as a silicon wafer. Alternatively or additionally, the substrate 102 may include elementary semiconductor materials, compound semiconductor materials, and/or alloy semiconductor materials. Examples of elementary semiconductor materials may include, but are not limited to, silicon and germanium. In certain embodiments, the substrate 102 is an intrinsic silicon substrate doped with n-type dopants to form n-well regions 108 and p-type dopants to form p-well regions 109, as appropriate. In certain embodiments, the substrate 102 is a p-type substrate containing p-type dopants to form a p-well region 109 and is doped with n-type dopants to form an n-well region 108. In certain embodiments, the substrate 102 is an n-type substrate containing n-type dopants to form an n-well region 108 and is doped with p-type dopants to form a p-well region 109.

At operation 20 of the method 10, one or more fin structures 103A are formed on the substrate 102 over the n-well region 108. One or more fin structures 103B may also be formed over the p-well region. The fin structure 103A and the fin structure 103B may be formed concurrently or be formed separately. In certain embodiments, the substrate 102 is patterned to form the fin structures 103A, 103B. The patterning process is performed to form recesses (not shown) in the substrate 102 defining the fin structures 103A, 103B in the substrate 102. The recesses have insulting material 105 formed therein. The fin structures 103A, 103B may be patterned by any suitable method. For example, the fin structures 103A, 103B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 103A, 103B.

As shown in FIG. 2, the substrate may also include an epitaxial material 110 formed over the substrate 102 to form the fin structure 103A. For example, the epitaxial material 110 may be deposited over the n-well region 108 of the substrate 102. The epitaxial material 110 forming the fin structure 103A may be silicon germanium ($Si_xGe_{1-x}$, where x can be between approximately 0 and 1). For example, the fin structure 103A of $Si_xGe_{1-x}$ having x in a range from about 0.05 to about 0.50 may be used to form a strained channel in a PFET device. In other embodiments, the epitaxial material 110 forming the fin structure 103A may be germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxial material 110 may be deposited by chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combination thereof.

In the embodiment shown in FIG. 2, patterning and etching the substrate 102 with epitaxial material 110 thereover may form the fin structures 103A, such as a SiGe fin structure; and patterning and etching the substrate 102 without the epitaxial material 110 or with a silicon epitaxial material thereover may form a silicon fin structures 103B. In other embodiments, the fin structure 103A over the n-well region 108 may also comprise a silicon fin structure without the epitaxial material 110.

The recesses defining the fin structures 103A, 103B may be filled with insulating material 105, in accordance with some embodiments. The insulating material 105 may form shallow trench isolation (STI) structures. The insulating material 105 may be or comprise silicon oxide, silicon nitride, silicon oxynitride, phospho-silicate glass (PSG), boro-silicate glass (BSG), boron-doped phospho-silicate glass (BPSG), other dielectric layers, or multiple layers thereof. The insulating material 105 may be deposited, such as by any acceptable deposition process, and recessed such that the fin structures 103A, 103B protrude above the insulating material 105.

In other embodiments, a dielectric layer can be formed over a top surface of the semiconductor substrate 102; trenches can be etched through the dielectric layer; epitaxial structures (e.g., homoepitaxial or heteroepitaxial structures) can be epitaxially grown in the trenches; and the dielectric layer can be recessed such that the epitaxial structures protrude from the dielectric layer to form fins. Fins formed by these processes can have a general structure similar to what is shown in FIG. 2.

Figure 3A:
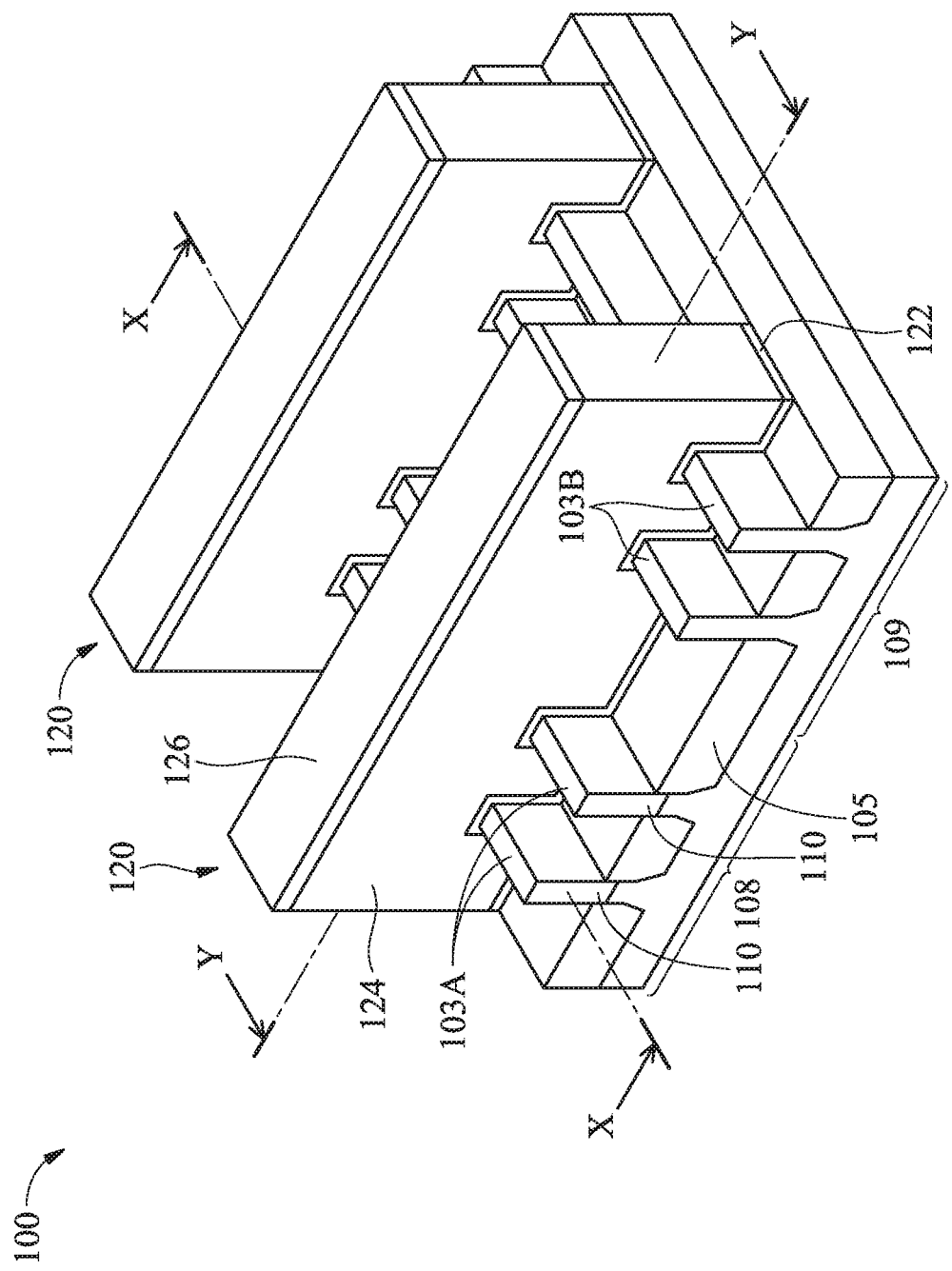
FIG. 3A is a perspective view of a substrate with two gate structures formed over a first set of two fin structures and a second set of two fin structures, in accordance with some embodiments.
Figure 3B:
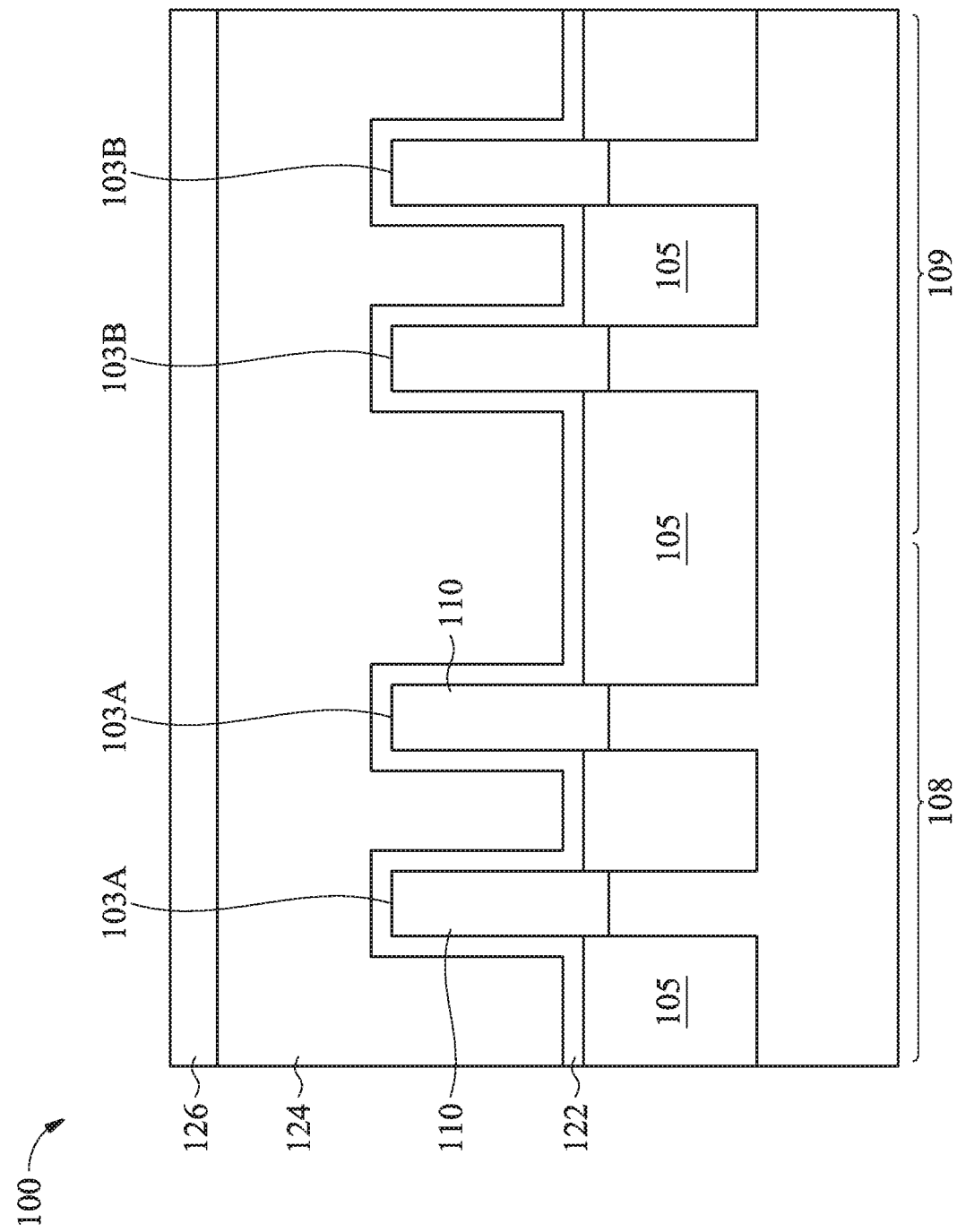
Figure 3C:
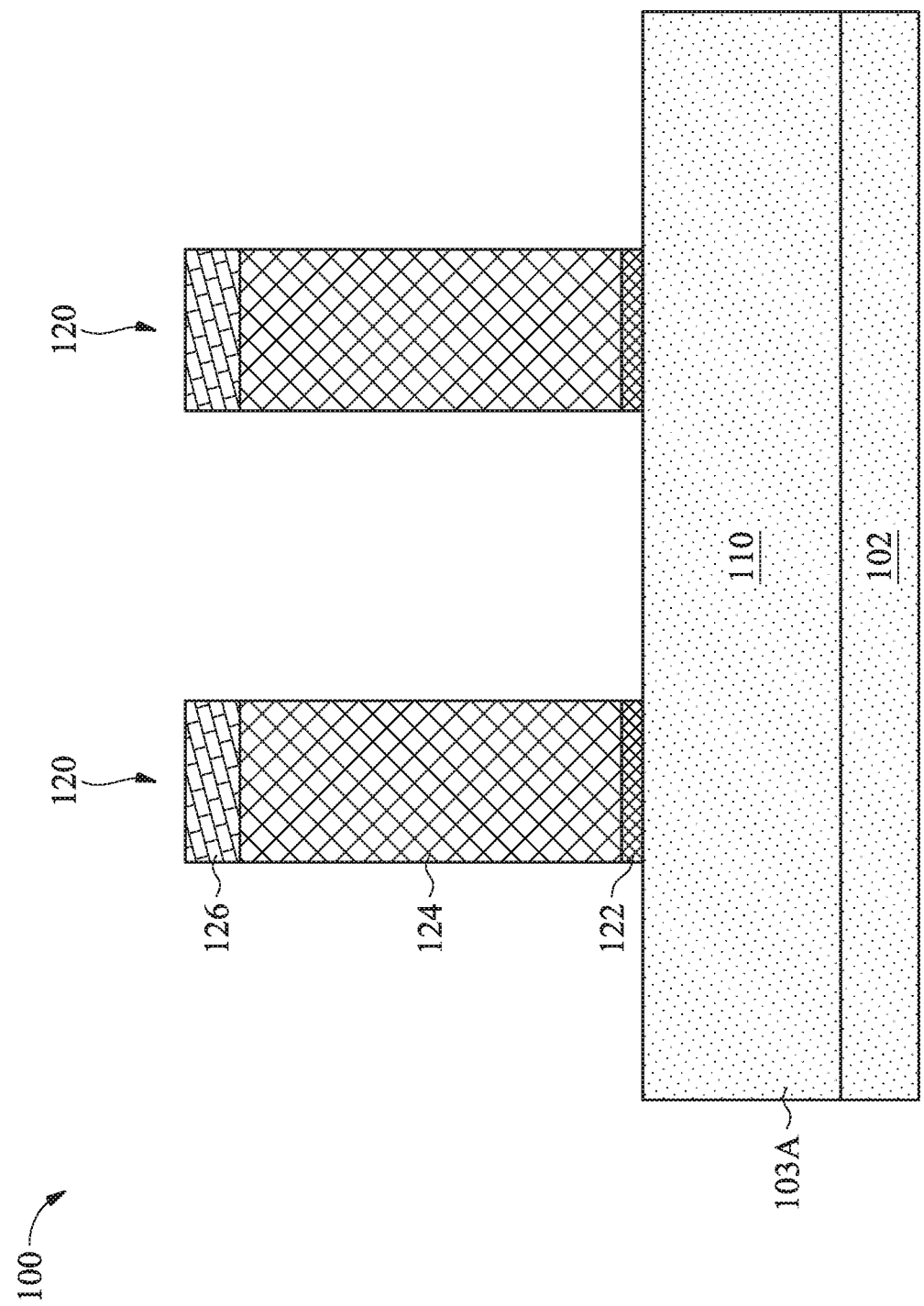

At operation 30 of the method 10, a gate structure, such as a dummy gate structure 120, is formed over the fin structures 103A, 103B as shown in FIGS. 3A-3C. FIG. 3A is a perspective view of the substrate 102 of FIG. 2 with two dummy gate structures 120 formed over two fin structures 103A, such as SiGe fins or Si fins, and two fin structures 103B, such as Si fins, in accordance with some embodiments. FIG. 3B is a cross-section view of substrate 102 in plane-Y of FIG. 3A longitudinally along one of the dummy gate structures 120. The semiconductor structure 100 of FIGS. 3A-3B shows one stage of manufacturing a complementary metal-oxide-semiconductor device. A gate structure formed over the fin structure 103A formed over the n-well region 108 may form a PFET device. A gate structure formed over the fin structure 103B formed over the p-well region 109 may form a NFET device. FIG. 3C is a cross-section view of substrate 102 in plane-X of FIG. 3A through a fin structure 103A over the n-well region 108.

The dummy gate structures 120 may include a dielectric layer 122, one or more dummy layers 124, and a hard mask layer 126. The dielectric layer 122 may be a silicon oxide, silicon oxynitride, other dielectric layers, and multi-layers thereof. The dummy layer 124 may be a polysilicon layer or other suitable material. The hard mask layer 126 may be any suitable material, such as silicon nitride, silicon oxynitride, silicon carbon nitride, to pattern the dummy gate structures 120 with desired features/dimensions on the substrate. The dielectric layer 122, the dummy layer 124, and the hard mask layer 126 may be deposited by one or more suitable deposition processes. The dummy gate structures 120 are patterned by suitable photolithography and etching techniques to expose portions of the fin structures 103A, 103B. The dummy gate structure 120 engages the top and sides of the fin structures 103A, 103B.

The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process.

Figure 4:
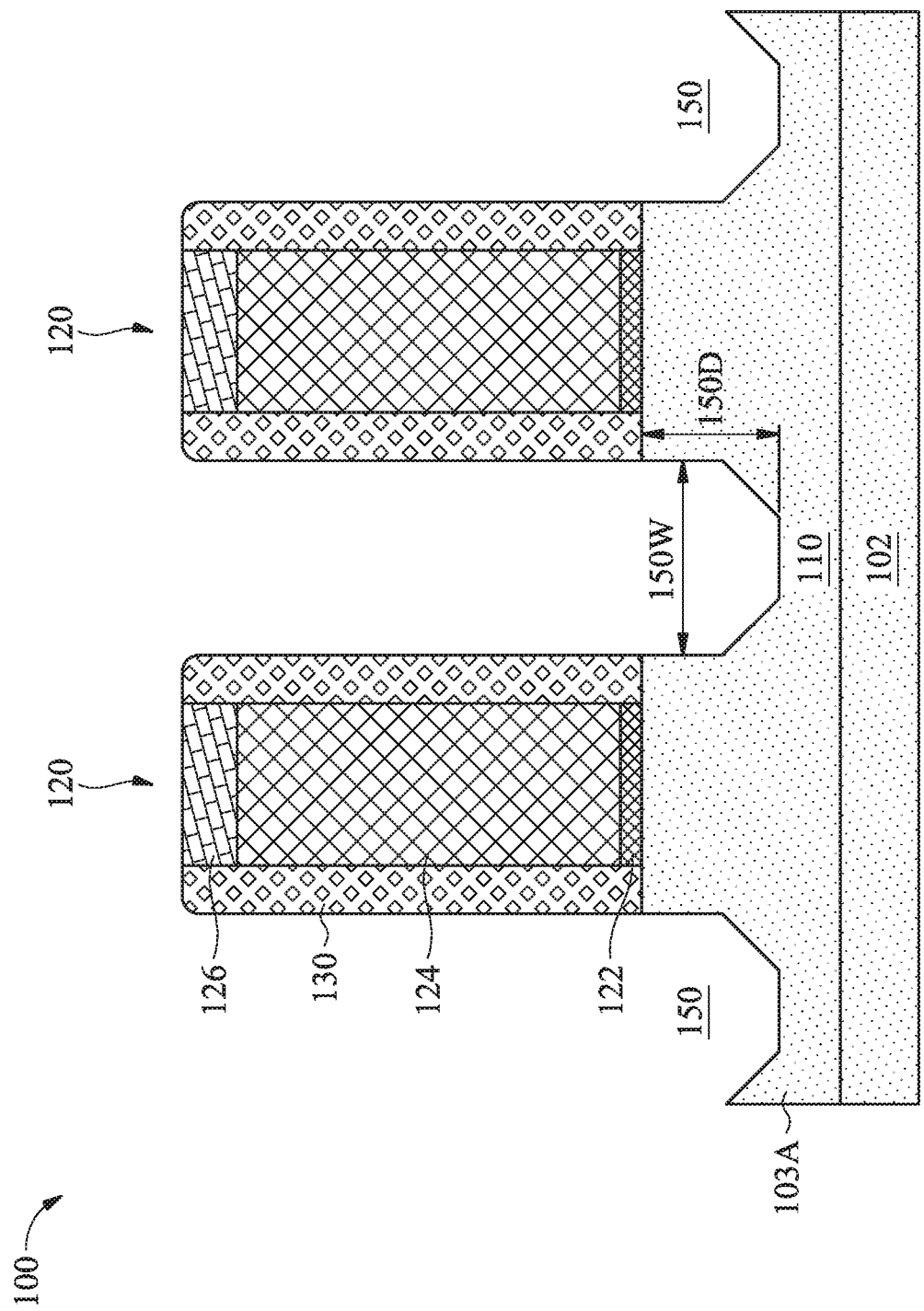

In FIG. 4, gate spacers 130 are formed along sidewalls of the dummy gate structures 120. FIG. 4 is a cross-section view of the substrate through a fin structure 103A over the n-well region 108 of FIG. 3C. For ease of illustration, formation of semiconductor structures is described in FIG. 4 through FIG. 7 in reference to a fin structure 103A over the n-well region 108 while the fin structure 103B over the p-well region 109 is not shown. The fin structure 103B may be protected by a mask and/or concurrently processed with one or more steps of processing the fin structures 103A over the n-well region 108.

The gate spacers 130 may be or comprise silicon carbon nitride, silicon nitride, silicon carbide, silicon oxynitride, silicon oxide, other applicable materials, or a combination thereof. A layer for the gate spacers 130 may be deposited by a conformal deposition process and anisotropically etched, such as through a dry etching process, to remove the layer for the gate spacers 130 from a surface of the fin structure 103A while the gate spacers 130 remain along the sidewalls of the dummy gate structures 120.

At operation 40 of the method 10, recesses 150 are formed in the fin structure 103A. Areas of the fin structures 103A not covered by the dummy gate structures 120 and by the gate spacers 130 are etched to form the recesses 150, such as by a dry etching process and/or a wet etching process. For example, the recesses 150 may be formed by an anisotropic wet etchant, such as tetramethylammonium hydroxide (TMAH). TMAH produces <111> planes within the recesses 150 to form facet-shaped recesses. In certain embodiments, the substrate 102 may be etched by a TMAH etchant comprising an aqueous solution having a concentration of TMAH in a range from 1% to 30% with an etching temperature in a range from about 20° C. to about 90° C.

In other embodiments, the recesses 150 may be formed to have angular, rounded, and/or other shapes on a bottom and/or sidewall of the recesses 150. The recesses 150 may be formed to a desired depth and width in the fin structure 103A. For example, the depth 150D of the recesses 150 may be a depth in a range from about 30 nm to about 100 nm from the top of the fin structure 103A to the lowest point of the recess 150. In other embodiments, the depth 150D is in a range from about 40 nm to about 60 nm. The width 150W of the recesses 150 may be a width in a range from about 20 nm to about 90 nm from a widest length with the fin structure 103A. In other embodiments, the width 150W of the recesses 150 is in a range from about 30 nm to about 50 nm. The depth 150D and the width 150W of the recesses 150 provide sufficient space for a gradient doped region 160 to be formed at operation 50.

Figure 5A:
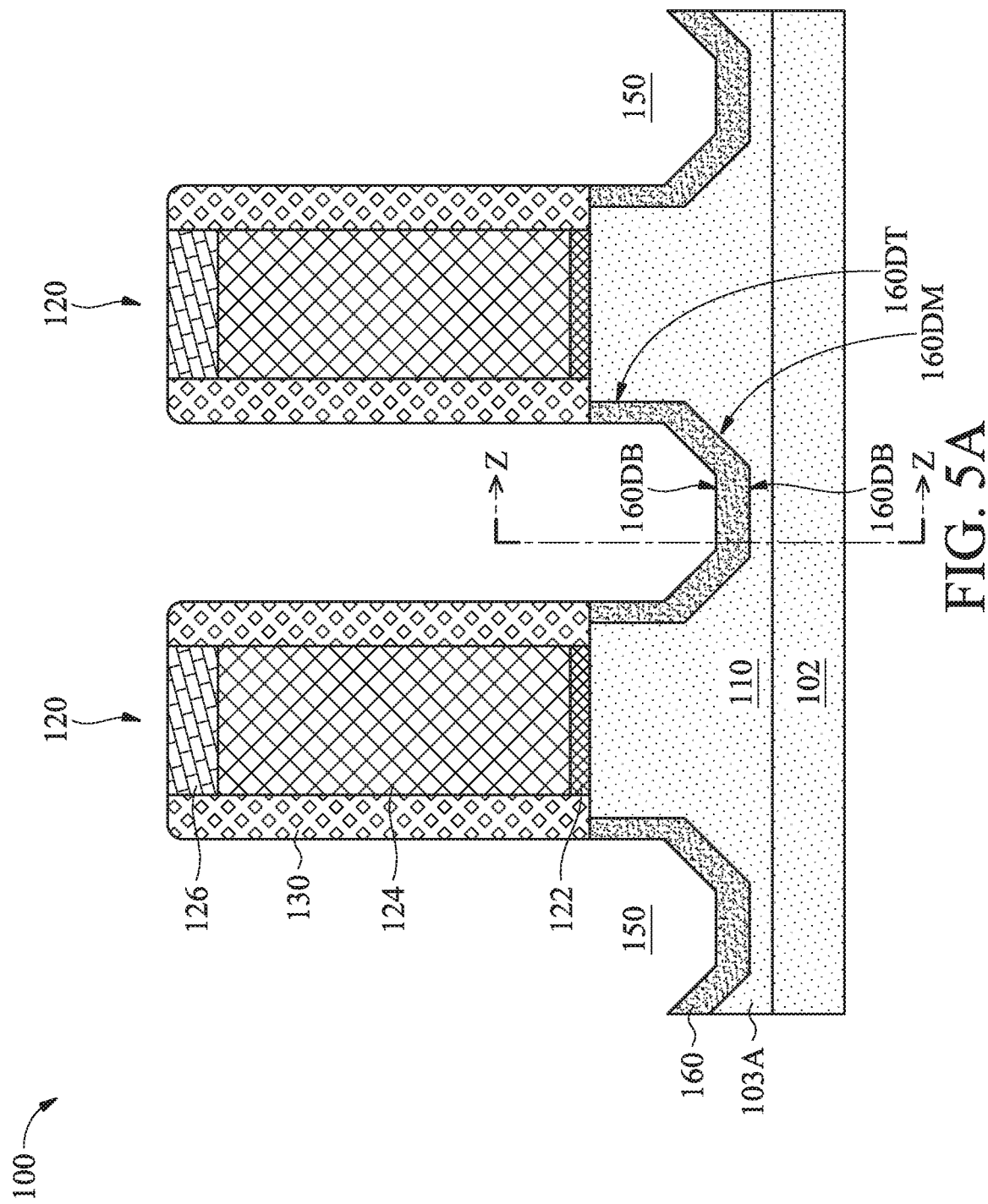
Figure 5B:
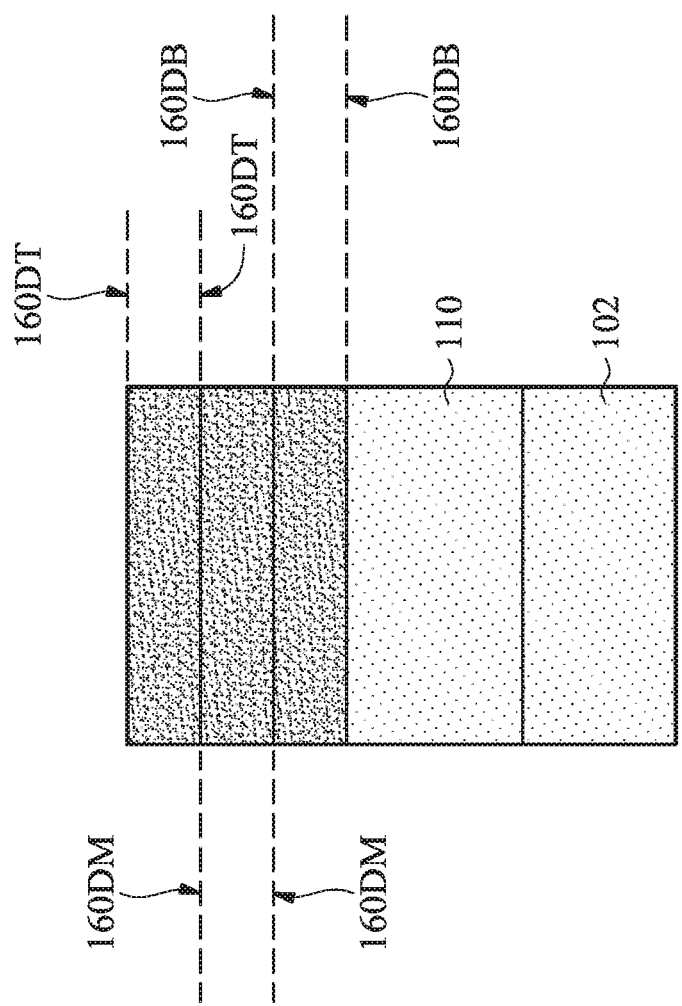

At operation 50 of the method 10, the gradient doped region 160 is formed in the recessed fin structure 103A as shown in FIGS. 5A-B. FIG. 5A is a cross-section view of the substrate 102 with formation of the gradient doped region 160 in the recessed fin structures 103A of FIG. 4, in accordance with some embodiments. FIG. 5B is a view of the gradient doped region 160 in direction-Z, in accordance with some embodiments. Dopants may be implanted into the recessed fin structures 103A using the dummy gate structures 120 and the gate spacers 130 as masks to form the gradient doped region 160 at the top of the fin structure 103A. Examples dopants include a boron dopant, such as boron difluoride ($BF_2$), for a p-type device, although other dopants may be used. In other embodiments, the dopant concentration is in a range of at least two orders of magnitude less than lightly doped source/drain (LDD) regions that may have been formed in conventional devices. In certain embodiments, the gradient doped region 160 differs from a lightly doped source/drain (LDD) region since implantation occurs after formation of the gate spacers 130. Implantation of LDD regions may cause too high of a concentration of dopants at the top of the recessed fin structures 103A. Too high of a concentration of dopants at the top of the fin structure 103A may result in undesirable diffusion of the dopant into the transistor channel, which may result in short channel effects (SCE) and/or may also damage the dummy gate structures 120, as well as other substrate features and layers. In some examples, LDD regions may be omitted from the fin structure 103A, although in other examples, LDD regions may be implemented in the fin structure 103A.

Dopants may be implanted into the recessed fin structure 103A using ion implantation to obtain a dopant gradient profile. One example of an ion implantation process to form the gradient doped region 160 includes an ion beam energy in a range from approximately 1 KeV to approximately 15 KeV, and includes at a tilt angle in a range from approximately 0 degrees to approximately 5 degrees. Implanting at a tilt angle may help to implant the sidewalls of the gradient doped region 160. The dopants are implanted to a depth 160DB at a bottom portion of the gradient doped region 160 in the fin structures 103 in a range from about 5 nm to about 20 nm in a dopant concentration in a range from about $1 \times 10^{19}$ $cm^{-3}$ to about $1 \times 10^{21}$ $cm^{-3}$. The dopants are implanted to a depth 160DM at a middle portion of the gradient doped region 160 in the fin structures 103 in a range from about 3 nm to about 15 nm in a dopant concentration in a range from about $5 \times 10^{18}$ $cm^{-3}$ to about $5 \times 10^{20}$ $cm^{-3}$. The dopants are implanted to a depth 160DT at a top portion of the gradient doped region 160 in the fin structures 103 in a range from about 1 nm to about 10 nm in a dopant concentration in a range from about $1 \times 10^{18}$ $cm^{-3}$ to about $1 \times 10^{20}$ $cm^{-3}$. In certain embodiments, implantation of dopants into the fin structure 103A may be conducted without a post-anneal and/or without additional cleaning steps.

Figure 6A:
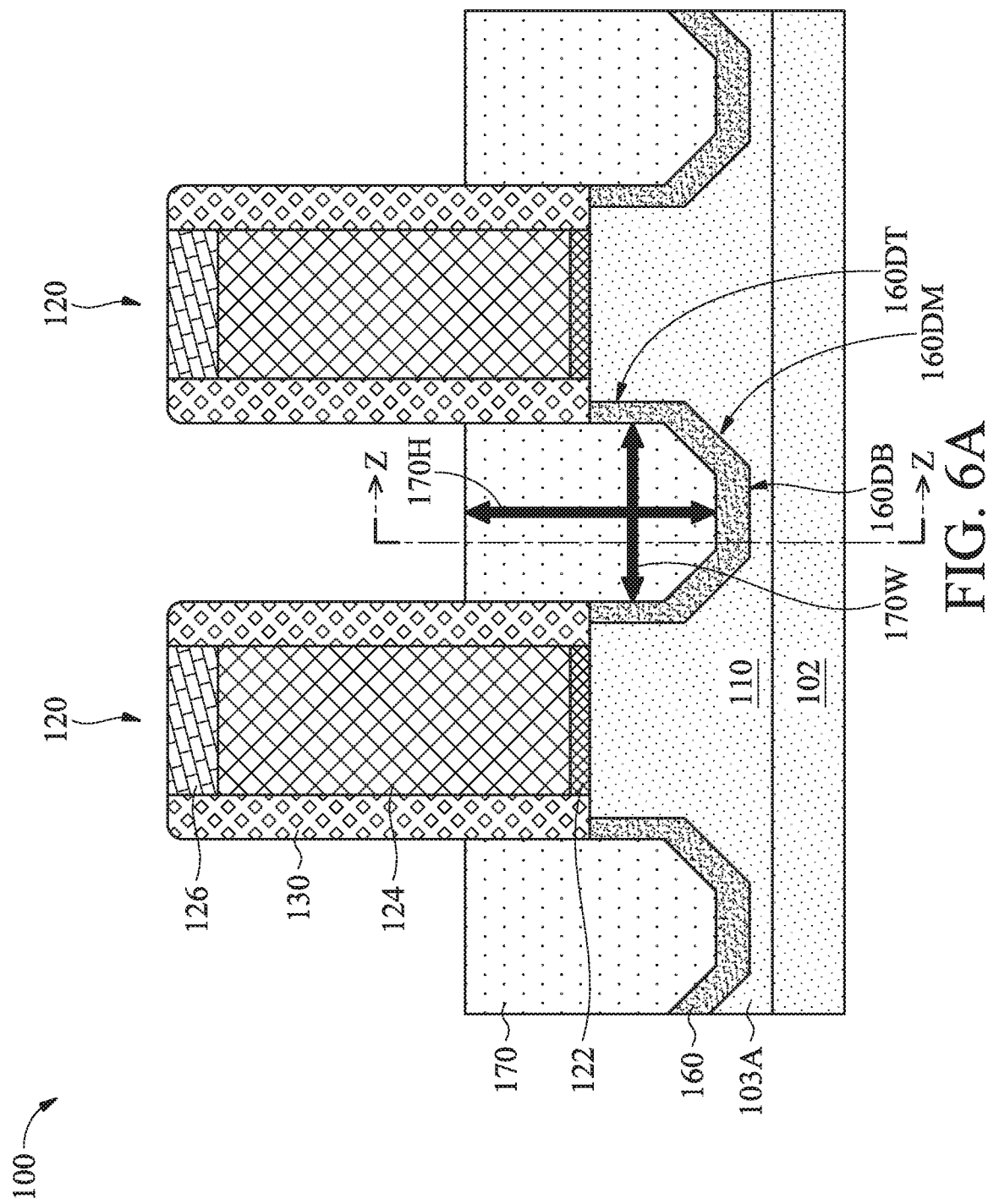
Figure 6B:
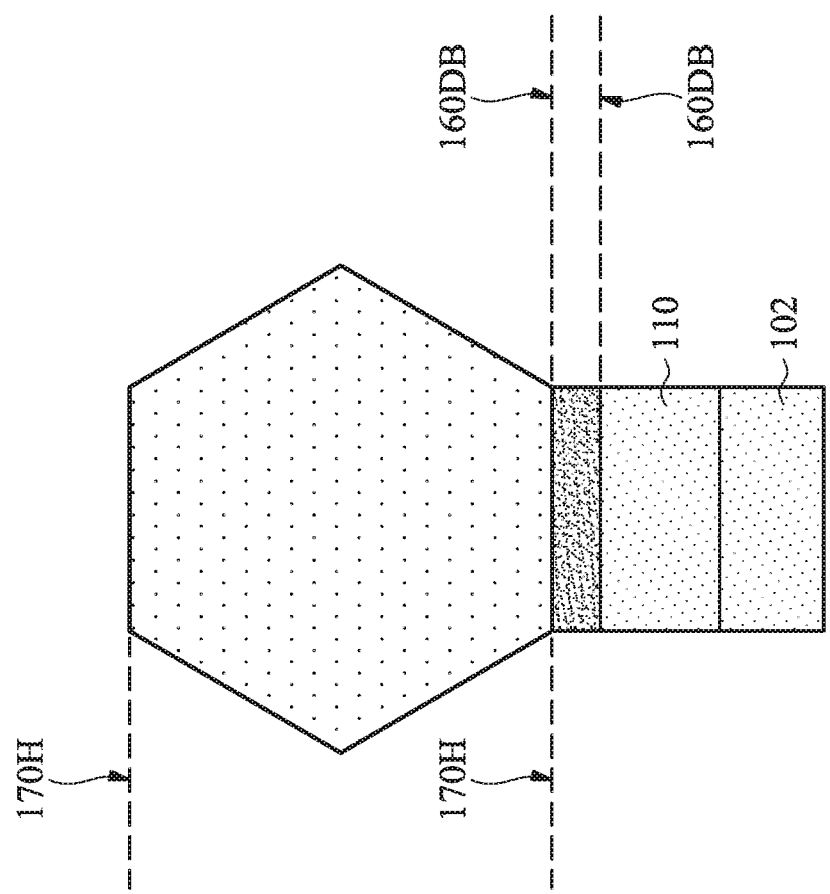

At operation 60 of the method 10, source/drain regions 170 are deposited on the gradient doped regions 160 in the recessed fin structure 103A as shown in FIGS. 6A-B in the p-type device region. FIG. 6A is a cross-section view of the substrate 102 with formation of source/drain regions 170 on the gradient doped regions 160 in the fin structures 103A of FIG. 5A, in accordance with some embodiments. FIG. 6B is a view of the gradient doped region 160 and a source/drain region 170 in direction-Z, in accordance with some embodiments. The source/drain regions 170 are disposed on the gradient doped region 160 of the recessed fin structures 103A on opposing sides of the dummy gate structure 120 and proximate to respective gate spacers 130. The dummy gate structure 120 formed over the n-well region 108 with a fin structure 103A having gradient doped regions 160 implanted with a p-type dopant subsequently forms a p-type FinFET structure.

The source/drain regions 170 comprise a semiconductor material epitaxially grown on the gradient doped regions in the recesses 150 of the recessed fin structures 103A. For example, the source/drain regions 170 of a p-type FinFET device may comprise silicon germanium (SiGe), boron-doped silicon germanium (SiGe:B) or boron (B) doped silicon material (Si:B), or the like. For example, source/drain regions 170 may comprise SiGe with a Ge content in a range from about 30% to about 70%. For example, the source/drain regions 170 may comprise SiGe:B with a Ge content in a range from about 30% to about 70% with a boron concentration in a range from about $1 \times 10^{19}$ atoms/$cm^3$ to about $5 \times 10^{21}$ atoms/$cm^3$. The Ge content of a SiGe source/drain regions 170 helps to induce strain in the channel device increasing carrier mobility. For example, Si:B may comprise a boron concentration in a range from about $1 \times 10^{19}$ atoms/$cm^3$ to about $5 \times 10^{21}$ atoms/$cm^3$. The boron concentration helps to increase carrier mobility between respective source/drain regions 170. The epitaxial growth of the source/drain regions 170 selectively grows on the crystalline surfaces of the recessed fin structure 103A. During the epitaxial deposition process, the source/drain regions 170 may grow both vertically and horizontally to form facets, which may correspond to crystalline planes of the fin structure 103A. Due to different growth rates are occurring at different surfaces with different crystallographic orientations, the resultant shape of the source/drain region 170 may be a diamond like structure or other shapes depending on the bottom surface of the recess 150 and depending on a lateral and a vertical growth of the epitaxial growth of the source/drain regions 170.

The source/drain regions 170 may be formed by depositing multiple layers with different concentrations of elements (e.g., dopants and/or semiconductor elements like germanium). The source/drain regions 170 may be merged or may be unmerged with neighboring source/drains on neighboring parallel fin structures.

The source/drain regions 170 may be deposited by molecular beam epitaxy (MBE), liquid phase epitaxy (LPE), vapor phase epitaxy (VPE), selective epitaxial growth (SEG), the like, or a combination thereof), any other suitable deposition process, or any combinations thereof. The source/drain regions 170 may be in situ doped during epitaxial deposition and/or by implanting dopants into the source/drain regions 170.

In certain embodiments, the source/drain regions 170 may induce strain in a channel defined by the fin structure 103A covered by the dummy gate structure 120. For example, the source/drain regions 170 comprising silicon germanium may induce a compressive strain within the channel. The strained channel layer increases carrier mobility and thus, increasing drive current of the formed device, such as a FinFET device.

Figure 7:
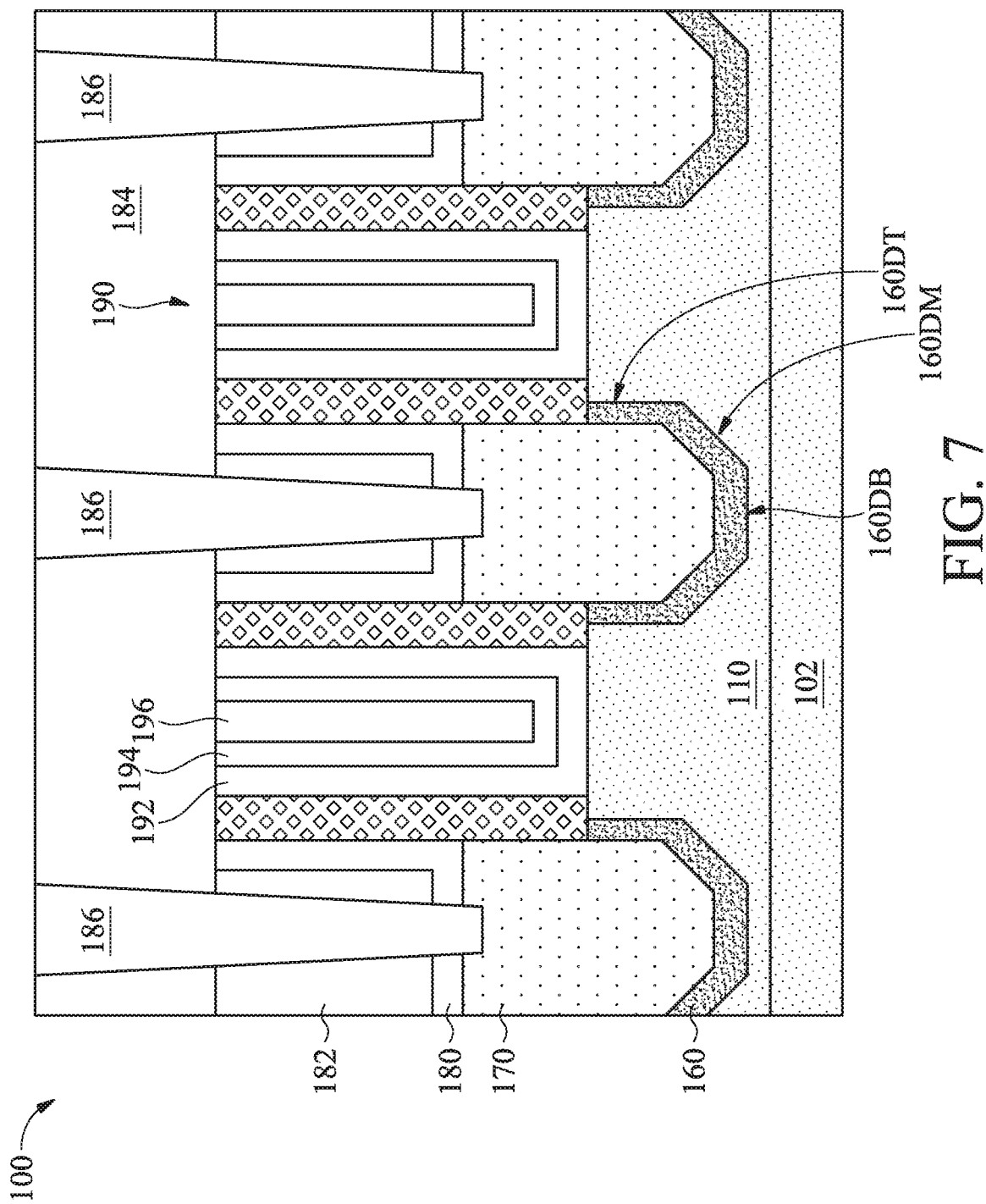

FIG. 7 illustrates an intermediate structure after forming a contact etch stop layer (CESL) 180 and a first interlayer dielectric (ILD) 182 over the CESL 180. Generally, an etch stop layer can provide a mechanism to stop an etch process when forming contacts or vias. An etch stop layer may be formed of a dielectric material having a different etch selectivity from adjacent layers or components. The CESL 180 is conformally deposited, such as by an appropriate deposition process, on surfaces of the source/drain regions 170 and sidewalls and top surfaces of the gate spacers 130. The CESL 180 may comprise or be silicon nitride, silicon carbon nitride, silicon carbon oxide, carbon nitride, the like, or a combination thereof. The first ILD 182 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof. The first ILD 182 may be planarized after being deposited, such as by a CMP, which may remove the hard mask layers 126 and expose the dummy layers 124 of the dummy gate structures 120 of FIG. 6.

FIG. 7 further illustrates the intermediate structure after replacing the dummy gate structures 120 with respective replacement gate structures 190, forming a second ILD 184, and forming contacts 186. The dummy gate structures 120 are removed, such as by an appropriate etching process, to form trenches. The trenches are filled with respective replacement gate structures 190. The replacement gate structures 190 each include a gate dielectric layer 192, an optional metal liner layer 194, a work function tuning layer 195, and a conductive gate fill 196. The conformal gate dielectric layer 192, optional metal liner layer 194, and conductive gate fill 196 can be deposited by appropriate deposition techniques.

The gate dielectric layer 192 is formed conformally in the trench, such as along sidewall and top surfaces of the fin structure 103A and along sidewalls of the gate spacers 130. The gate dielectric layer 192 may be a silicon oxide, silicon nitride, a high-k dielectric material, or multilayers thereof. A high-k dielectric material, such as a dielectric having a k value greater than about 7.0, may include or be a metal oxide or a silicate of Hf, Al, Zr, La, Mg, Ti, Y, Sc, Lu, Gd, Sr, Dy, Ca, Sm, or a combination thereof.

One or a plurality of metal liner layers 194 can be formed conformally over the gate dielectric layer 192. The metal liner layers 194 can include a capping layer and/or a barrier layer. A capping layer and a barrier layer can be used to prevent impurities from diffusing into or away from underlying layers. The capping layer and/or barrier layer may include tantalum nitride, titanium nitride, the like, or combinations thereof.

The work function tuning layer 195 can be chosen to tune the work function value so that a desired threshold voltage Vt is achieved in the transistor that is formed. Examples of a work function tuning layer include TaAl, TaN, TaAlC, TaC, TaCN, TaSiN, Ti, TiN, TiAlN, Ag, Mn, Zr, Ru, Mo, Al, WN, $ZrSi_2$, $MoSi_2$, $TaSi_2$, $NiSi_2$, other suitable work function materials, or a combination thereof.

A conductive gate fill 196 is formed over the work function tuning layer 195 and fills the trench. The conductive gate fill 196 may comprise a metal-containing material such as tungsten (W), cobalt (Co), ruthenium (Ru), aluminum (Al), titanium nitride (TiN), tantalum nitride (TaN), tantalum carbon (TaC), titanium aluminum nitride (AlTiN), titanium aluminum carbon (AlTiC), titanium aluminum oxide (AlTiO), a combination thereof, and multi-layers thereof.

Portions of the layers for the conductive gate fill 196, the optional metal liner layer 194, and the gate dielectric layer 192 above the top surfaces of the first ILD 182, the CESL 180, and the gate spacers 130 are removed, such as by a planarization process, like a CMP process.

The second ILD 184 is formed over the first ILD 182, the replacement gate structures 190, the gate spacers 130, and the CESL 180. Although not illustrated, in some examples, an etch stop layer (ESL) may be deposited over the first ILD 182, and the second ILD 184 may be deposited over the ESL. The second ILD 184 may comprise or be silicon dioxide, a low-k dielectric material, silicon oxynitride, PSG, BSG, BPSG, USG, FSG, OSG, SiOxCy, Spin-On-Glass, Spin-On-Polymers, silicon carbon material, a compound thereof, a composite thereof, the like, or a combination thereof. The second ILD 184 may be deposited by any acceptable deposition technique.

Openings through the second ILD 184, the first ILD 182, and the CESL 180 to the source/drain regions 170 are formed to expose at least portions of the source/drain regions 170, such as by using appropriate photolithography and one or more etch processes. Contacts 186 are formed in the openings to the source/drain regions 170. The contacts 186 may include a fill metal, such as tungsten, aluminum, cobalt, ruthenium, copper, or other suitable metals. The contacts 186 may further include silicide on the respective source/drain regions 170 and a barrier and/or adhesion layer between the fill metal and sidewalls of the openings.

Figure 8:
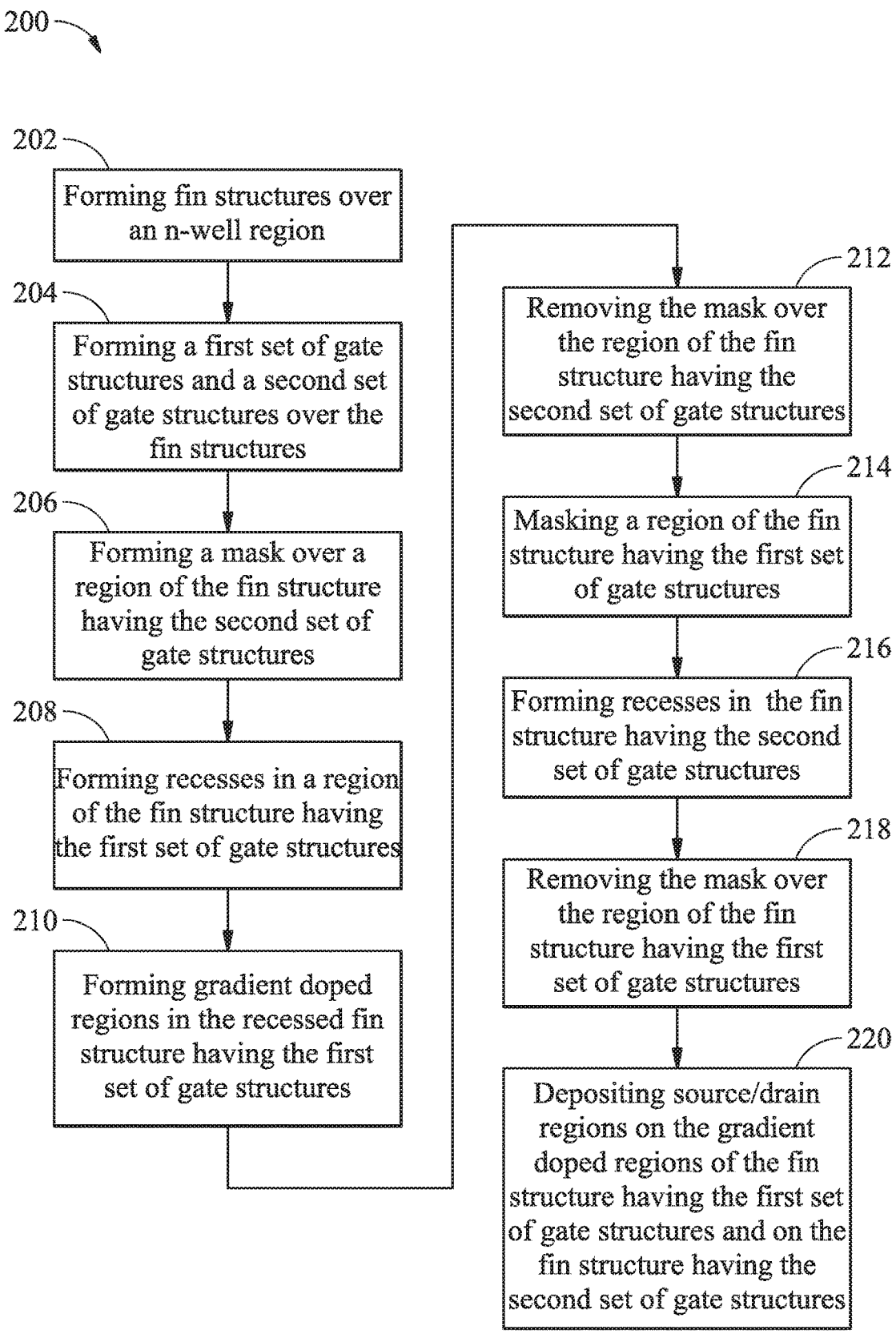
FIG. 8 is a flow diagram illustrating another method of manufacturing a semiconductor device, such as a FinFET structure, over a substrate, in accordance with some embodiments.

FIG. 8 is a flow diagram illustrating another method 200 of manufacturing a semiconductor device, such as a FinFET structure, on a substrate, in accordance with some embodiments. The method 200 is described in reference to FIG. 9 to FIG. 14, which are schematic diagrams of various stages of manufacturing a semiconductor structure 100, such as FinFET semiconductor devices, on a substrate 102, in accordance with some embodiments.

Figure 9:
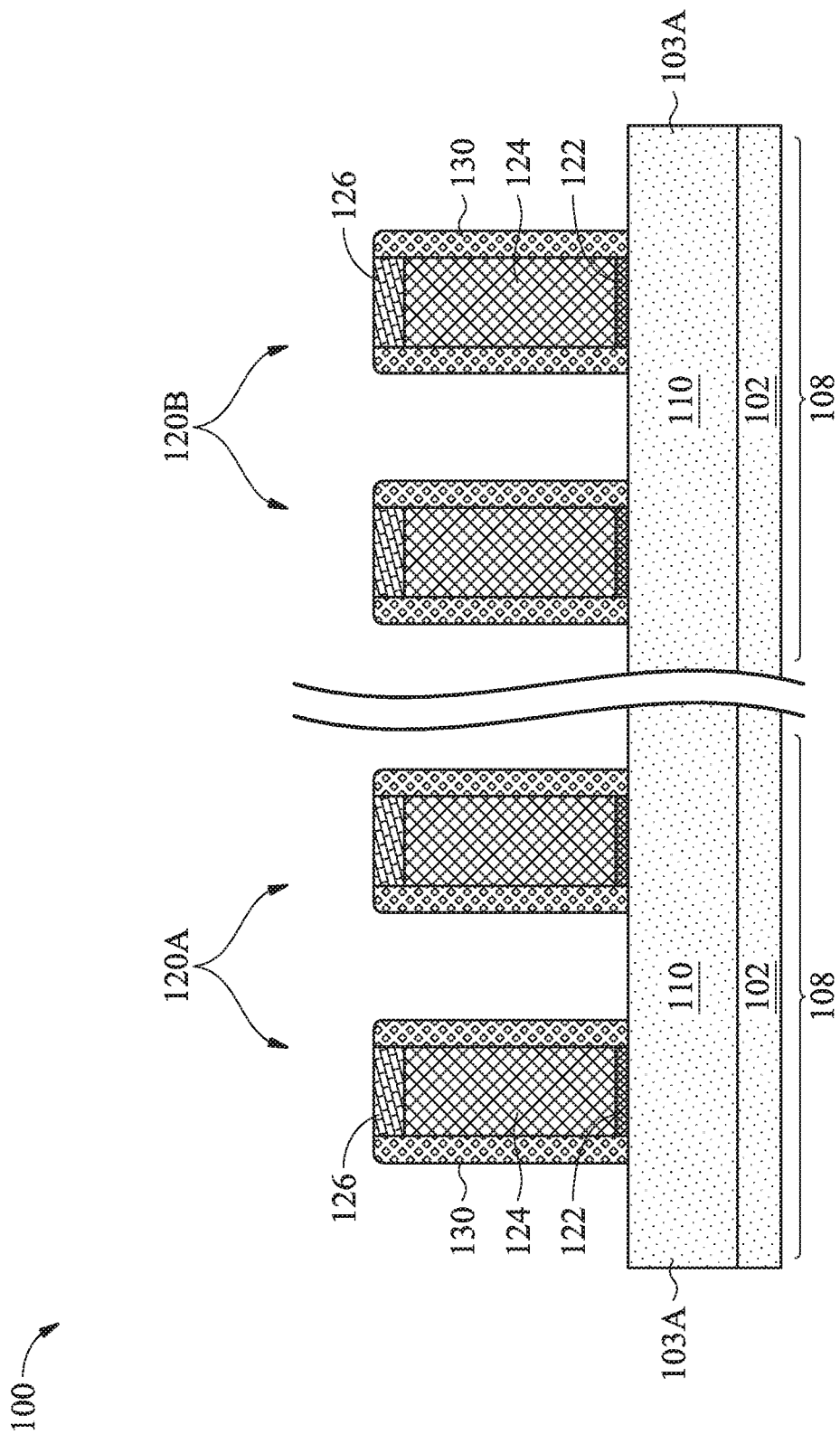
FIGS. 9, 10, 11, 12, 13, and 14 illustrate cross-sectional views of intermediate structures of a semiconductor device at intermediate stages of manufacturing the semiconductor device, in accordance with some embodiments.

At operation 202 of the method 200, the fin structures 103A are formed on the substrate 102 over the n-well region 108 as shown in FIG. 9. The fin structures 103A of FIG. 9 is formed in similar to the fin structure 103A of FIG. 3C; hence, like numeral are used for ease of description. The fin structures 103A may be SiGe fin structures and/or Si fin structures.

At operation 204 of the method 200, a first set of gate structures and a second set of gate structures are over the fin structures 103A. For example, two sets of dummy gate structures 120A, 120B are formed over the fin structure 103A formed over an n-well region 108. The two sets of dummy gate structures 120A, 120B are each shown as two dummy gate structures, but any number of gate structures may be formed. The sets of dummy gate structures 120A, 120B may be formed on the same or separate fin structures 103A. Each dummy gate structure 120A, 120B may comprise a dielectric layer 122, one or more dummy layers 124, and a hard mask layer 126. Gate spacers 130 are formed along sidewalls of the dummy gate structures 120A, 120B, such as describe previously.

Each set of the dummy gate structures 120A, 120B may be in different regions, such as a logic core region, a memory region (such as an embedded static random access memory (SRAM) region), an analog region, an input/output (also referred to as a peripheral) region, a dummy region (for forming dummy patterns), and the like. For example, the dummy gate structures 120A may be used in a memory region, such as a SRAM region, and the dummy gate structure 120B may be used in a logic core region.

Figure 10:
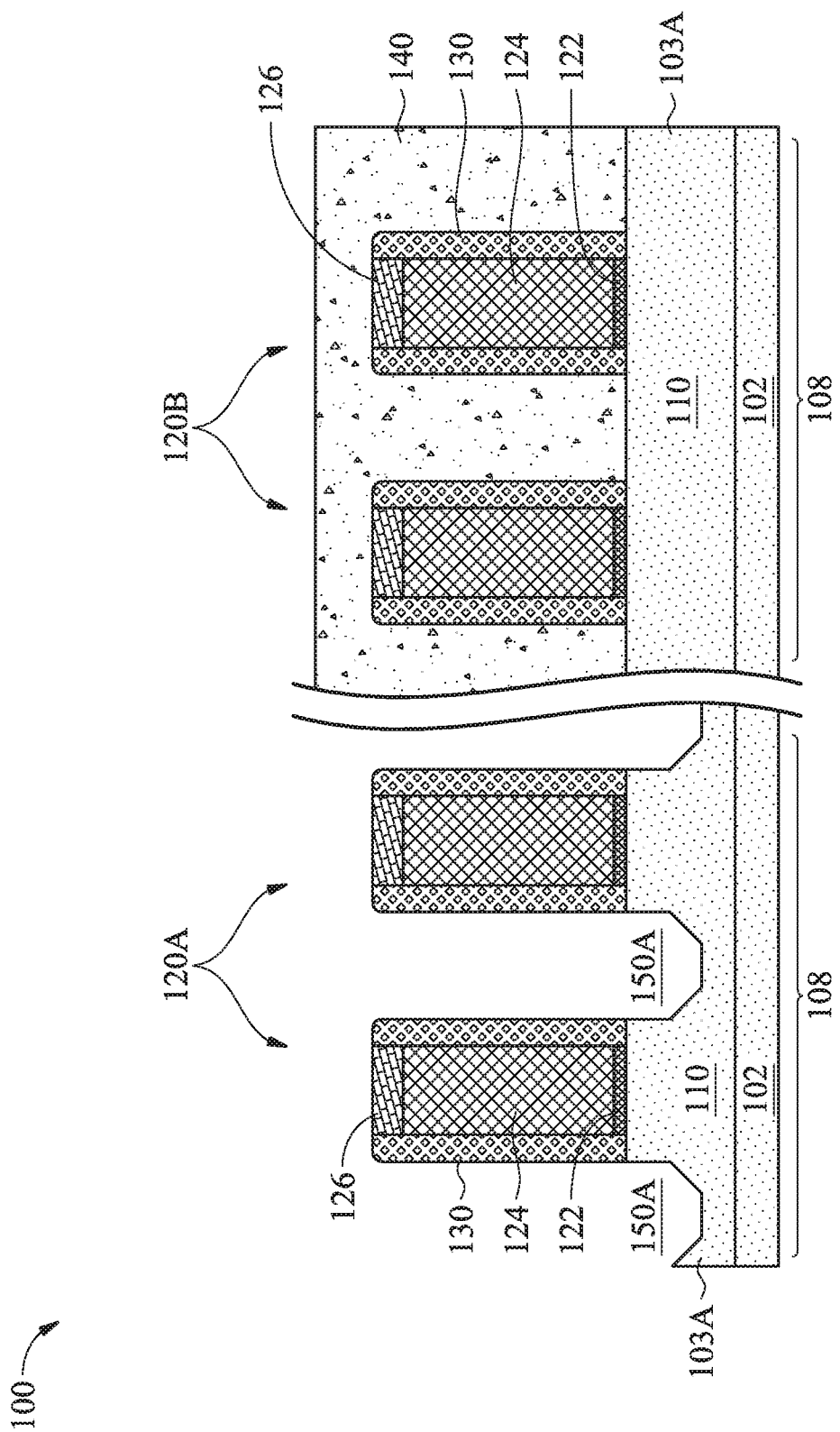

At operation 206, a mask 140 is formed over a region of the fin structures 103A having the second set of gate structures (i.e., dummy gate structures 120B) while a region of the fin structures 103A having the first set of gate structure (i.e., dummy gate structures 120A) are not covered by the mask 140 as shown in FIG. 10. The mask 140 may be a developed photoresist or may be a hard mask patterned by use of a developed photoresist.

At operation 208 of the method 200, recesses 150A are formed in a region of the fin structures 103A have the first set of gate structures (i.e., dummy gate structures 120A). Areas of the fin structures 103A not covered by the dummy gate structures 120A and by the gate spacers 130 are etched to form the recesses 150A. The recesses 150A may be formed to have either an angular, rounded, or flat shape on a bottom and/or sidewall of the recesses 150A. The recesses 150A may be formed to a desired depth in the fin structure 103A.

Figure 11:
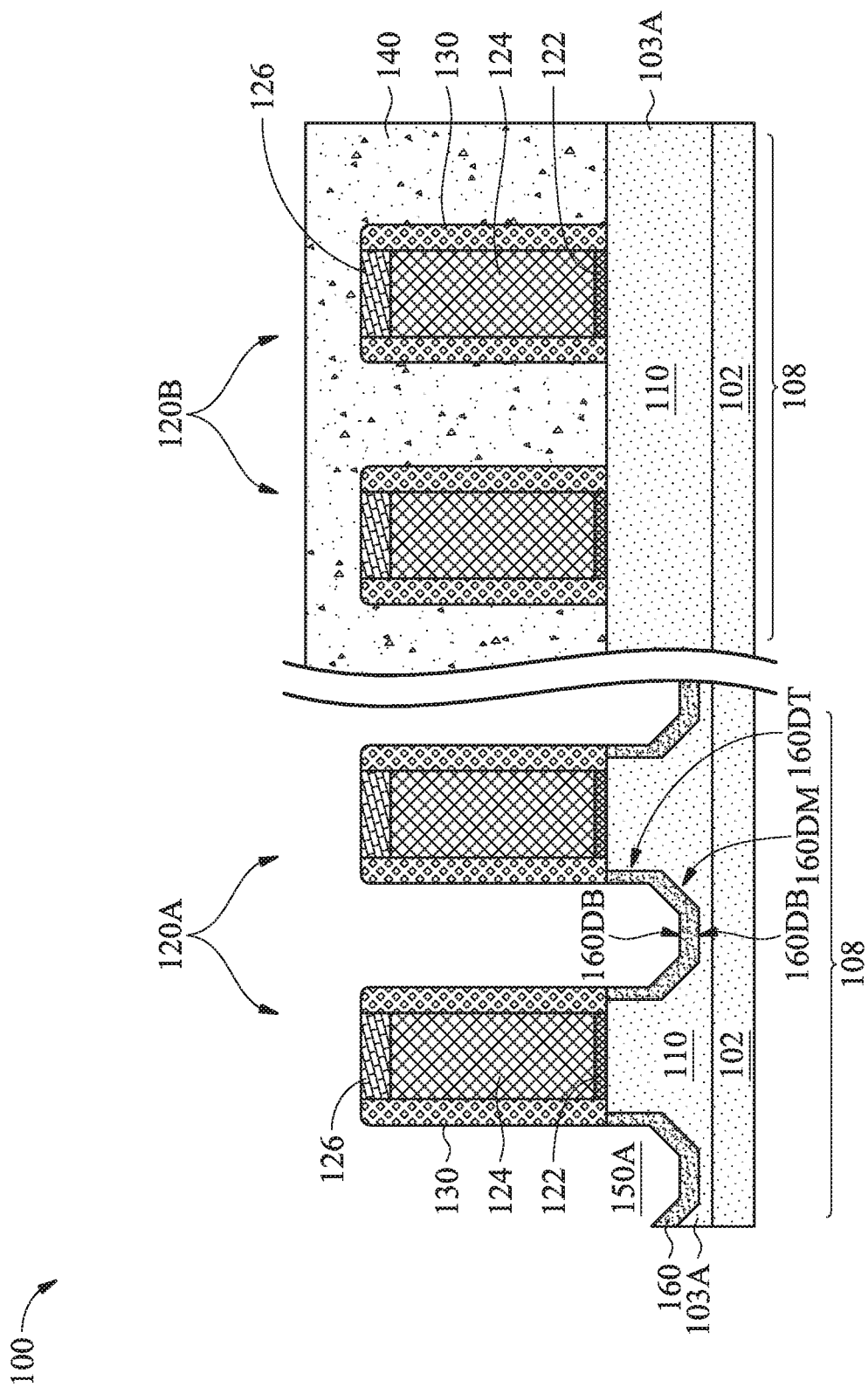

At operation 210 of the method 200, gradient doped regions 160 are formed in the recessed fin structure 103A as shown in FIG. 11. FIG. 11 is a cross-section view of the substrate 102 with formation of the gradient doped regions 160 in the recessed fin structures 103A of FIG. 10, in accordance with some embodiments. Dopants may be implanted into the recessed fin structures 103A using the dummy gate structures 120A and the gate spacers 130 as masks to form the gradient doped regions 160 at the top of the fin structures 103A.

In other embodiments, the dopant concentration is in a range of at least two orders of magnitude less than lightly doped source/drain (LDD) regions that may have been formed in conventional devices. Implantation of LDD regions may cause too high of a concentration of dopants at the top of the recessed fin structures 103A. Too high of a concentration of dopants at the top of the fin structures 103A may result in undesirable diffusion of the dopant into the transistor channel, which may result in short channel effects (SCE) and/or may also damage the dummy gate structures 120, as well as other substrate features and layers. In some examples, LDD regions may be omitted from the fin structure 103A, although in other examples, LDD regions may be implemented in the fin structure 103A.

Dopants may be implanted into the recessed fin structure 103A using ion implantation to obtain a dopant gradient profile. Examples dopants include a boron dopant, such as boron difluoride ($BF_2$), for a p-type device, although other dopants may be used. One example of an ion implantation process to form the gradient doped regions 160 includes an ion beam energy in a range from approximately 1 KeV and approximately 15 KeV, and includes at a tilt angle in a range from approximately 0 degrees and approximately 5 degrees. Implanting at a tilt angle may help to implant the sidewalls of the gradient doped region 160. The dopants are implanted to a depth 160DB at the bottom of the gradient doped region 160 in the fin structures 103 in a range from about 5 nm to about 20 nm in a dopant concentration in a range from about $1 \times 10^{19}$ $cm^{-3}$ to about $1 \times 10^{21}$ $cm^{-3}$. The dopants are implanted to a depth 160DM at the middle of the gradient doped region 160 in the fin structures 103 in a range from about 3 nm to about 15 nm in a dopant concentration in a range from about $5 \times 10^{18}$ $cm^{-3}$ to about $5 \times 10^{20}$ $cm^{-3}$. The dopants are implanted to a depth 160DT at the top of the gradient doped region 160 in the fin structures 103 in a range from about 1 nm to about 10 nm in a dopant concentration in a range from about $1 \times 10^{18}$ $cm^{-3}$ to about $1 \times 10^{20}$ $cm^{-3}$. In certain embodiments, implantation of dopants into the fin structure 103A may be conducted without a post-anneal and/or without additional cleaning steps.

Figure 12:
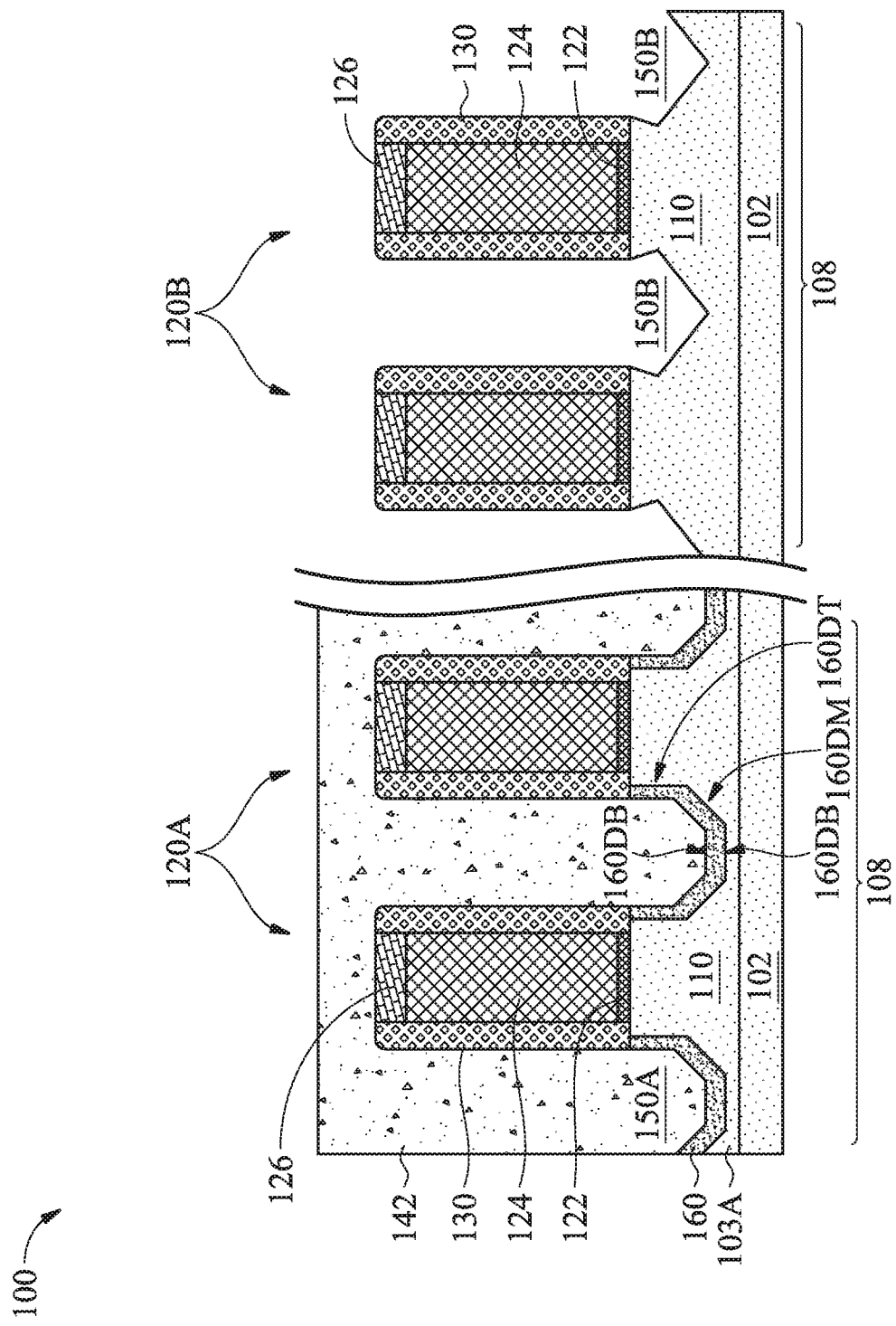

At operation 212, the mask 140 covering the region of the fin structure 103A having the dummy gate structures 120B are removed as shown in FIG. 12. The mask 140 may be removed by an ash, etch, wet strip, or another suitable process.

At operation 214, a mask 142 is formed over a region of the fin structures 103A having the first set of gate structures (i.e., dummy gate structures 120A) while a region of the fin structures 103A having the second set of gate structure (i.e., dummy gate structures 120B) are not covered by the mask 142. The mask 142 may be a developed photoresist or may be a hard mask patterned by use of a developed photoresist.

At operation 216 of the method 200, recesses 150B are formed in a region of the fin structures 103A have the second set of gate structures (i.e., dummy gate structures 120B). Areas of the fin structures 103A not covered by the dummy gate structures 120B and by the gate spacers 130 are etched to form the recesses 150B. The recesses 150B may be formed to have either an angular, rounded, or flat shape on a bottom and/or sidewall of the recesses 150B. The recesses 150B may be formed to a desired depth in the fin structure 103A.

Figure 13:
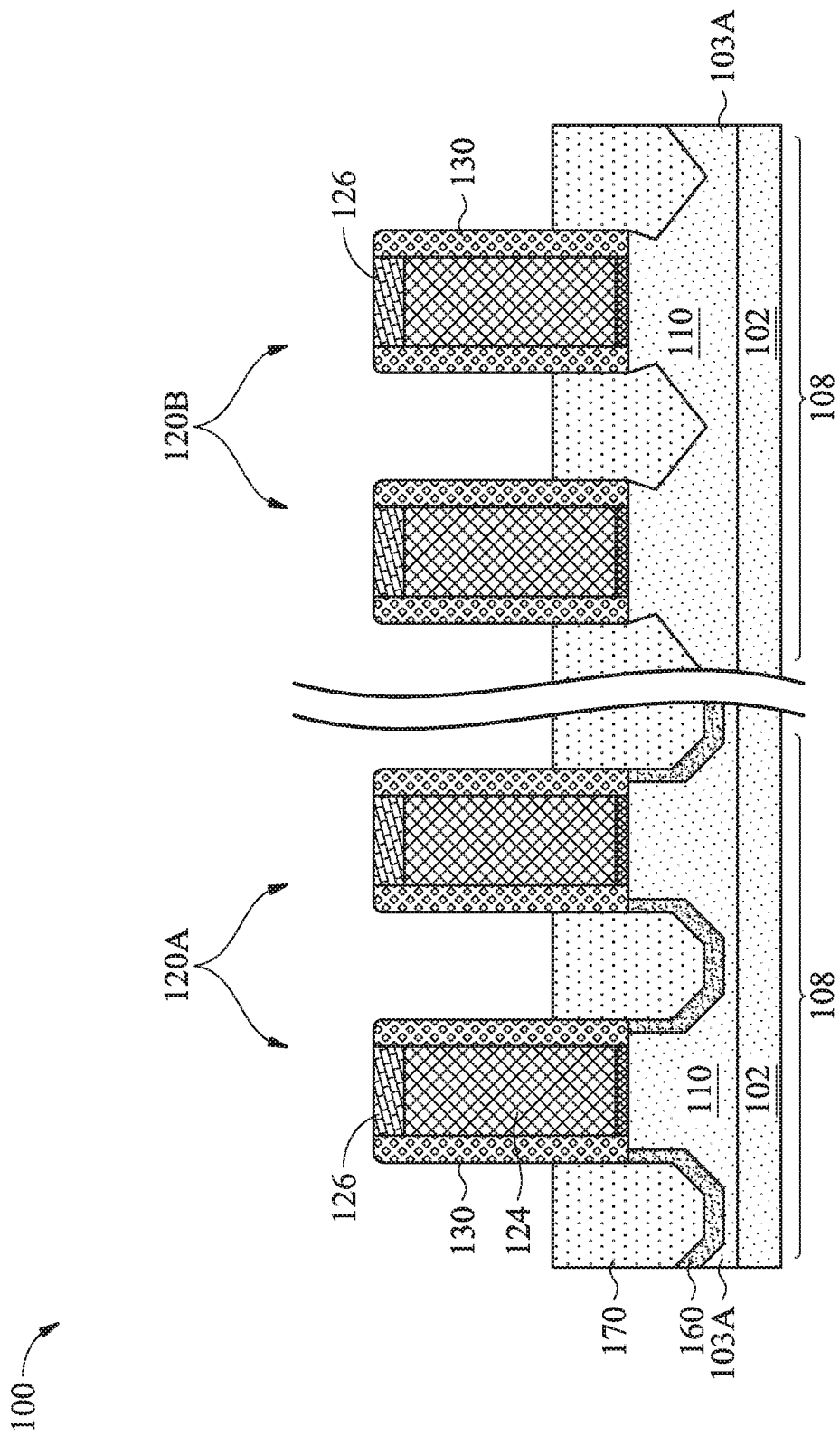

At operation 218, the mask 142 covering the region of the fin structure 103A having the dummy gate structures 120A are removed as shown in FIG. 13. The mask 142 may be removed by an ash, etch, wet strip, or another suitable process.

At operation 220 of the method 200, source/drain regions 170 are deposited on the gradient doped region 160 of the recessed fin structure 103A having the dummy gate structures 120A and are deposited on a region of the recessed fin structure 103A having the dummy gate structures 120B without a gradient doped region (i.e., an implant-free region). The region of the recessed fin structure 103A having the dummy gate structures 120 without a gradient doped region may subsequently include dopants from diffusion of dopants from the source/drain regions 170 into the recessed fin structure 103A.

The source/drain regions 170 comprise a semiconductor material epitaxially grown in the recesses 150A, 150B in the fin structures 103A. For example, the source/drain regions 170 of a p-type FinFET device may comprise silicon germanium (SiGe), boron-doped silicon germanium (SiGeB) or boron (B) doped silicon material (SixBy), or the like. The source/drain regions 170 may be formed by depositing multiple layers. The source/drain regions 170 may be merged or may be unmerged with neighboring source/drains on neighboring parallel fin structures. In certain embodiments, the source/drain regions 170 may induce strain in a channel defined by the fin structure 103A covered by the dummy gate structures 120A, 120B. For example, the source/drain regions 170 comprising silicon germanium may induce a compressive strain within the channel. The strained channel layer increases carrier mobility and thus, increasing drive current of the formed device, such as a FinFET device.

Figure 14:
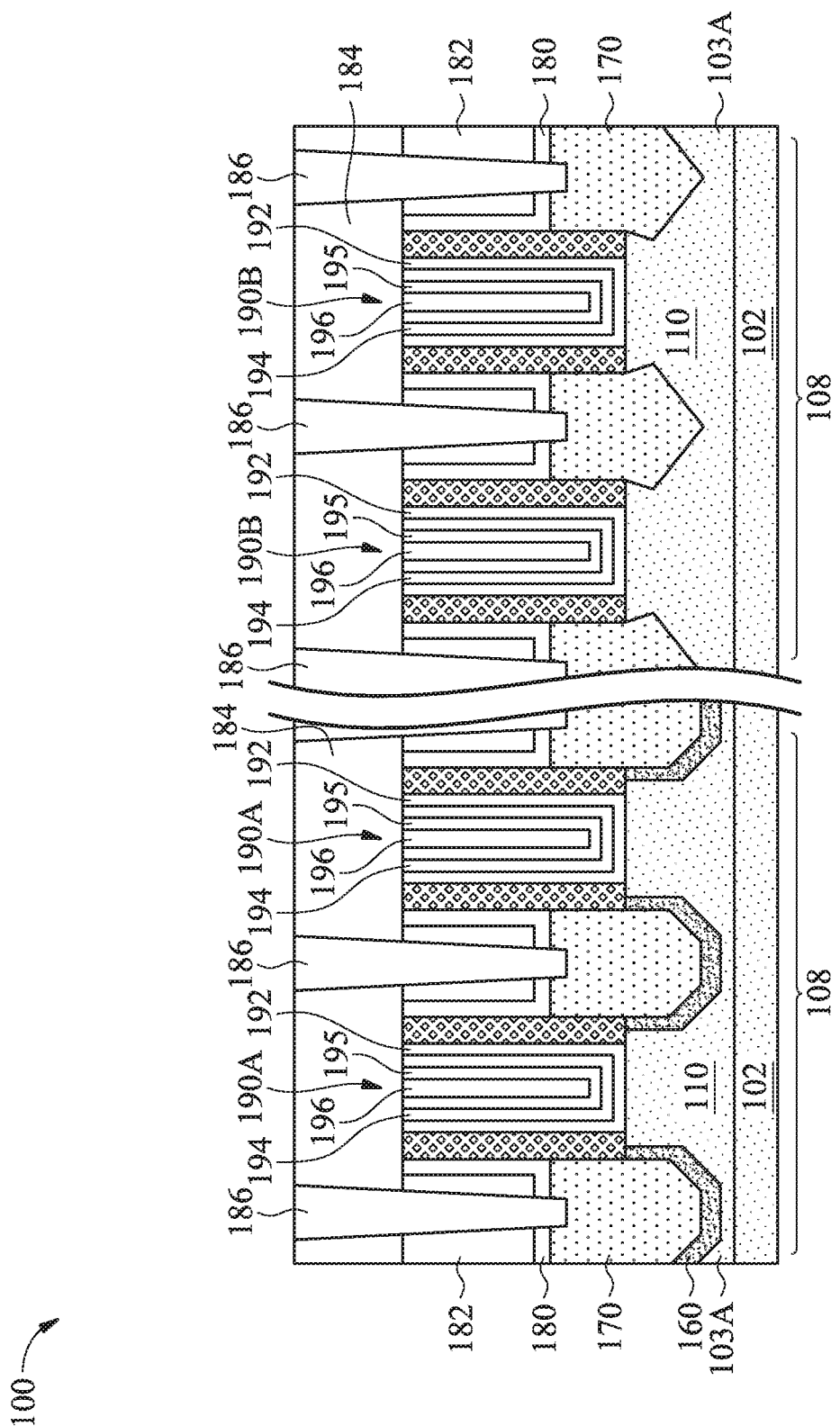

FIG. 14 illustrates an intermediate structure after forming a contact etch stop layer (CESL) 180 and a first interlayer dielectric (ILD) 182 over the CESL 180. The CESL 180 is conformally deposited, such as by an appropriate deposition process, on surfaces of the source/drain regions 170 and sidewalls and top surfaces of the gate spacers 130. The first ILD 182 may be planarized after being deposited, such as by a CMP, which may remove the hard mask layers 126 and expose the dummy layers 124 of the dummy gate structures 120 of FIG. 13.

FIG. 14 further illustrates the intermediate structure after replacing the dummy gate structures 120 with respective replacement gate structures 190, forming a second ILD 184, and forming contacts 186. The dummy gate structures 120 are removed, such as by an appropriate etching process, to form trenches. The trenches are filled with respective replacement gate structures 190. The replacement gate structures 190 each include a conformal gate dielectric layer 192, an optional metal liner layer 194, and a conductive gate fill 196. The conformal gate dielectric layer 192, optional metal liner layer 194, and conductive gate fill 196 can be formed like described above with respect to FIG. 7.

The second ILD 184 is formed over the first ILD 182, the replacement gate structures 190, the gate spacers 130, and the CESL 180. Although not illustrated, in some examples, an etch stop layer (ESL) may be deposited over the first ILD 182, etc., and the second ILD 184 may be deposited over the ESL. The second ILD 184 may be deposited by any acceptable deposition technique.

Openings through the second ILD 184, the first ILD 182, and the CESL 180 to the source/drain regions 170 are formed to expose at least portions of the source/drain regions 170, such as by using appropriate photolithography and one or more etch processes. Contacts 186 are formed in the openings to the source/drain regions 170. The contacts 186 may further include silicide on the respective source/drain regions 170 and a barrier and/or adhesion layer between the fill metal and sidewalls of the openings.

It is understood that fin structures 103A, 103B and dummy gate structures 120, 120A, 120B shown in FIGS. 2-7 and in FIGS. 9-14 are for illustration purposes only. The fins and gate structures may be formed in any number as needed depending on the application. While the gate structures discussed herein are fabricated using a replacement gate process, it is contemplated that the gate structures may be fabricated using a gate-first process as understood by those skilled in the art. While the source/drains discussed herein are fabricated using a recessed fin, source/drains may be fabricated by without forming recesses in the fin.

In certain embodiments, the method 200 forms PFET structures in different regions, where in one or more region, PFET structures are formed with gradient doped regions 160 and in one or more other region, PFET structures are formed without gradient doped regions (e.g., implant free). The method 200 enables tailoring the channel resistance of PFET structures for different regions, such a logic core region, memory region, analog region, an input/output region, a dummy region, and other suitable regions.

Figure 15:
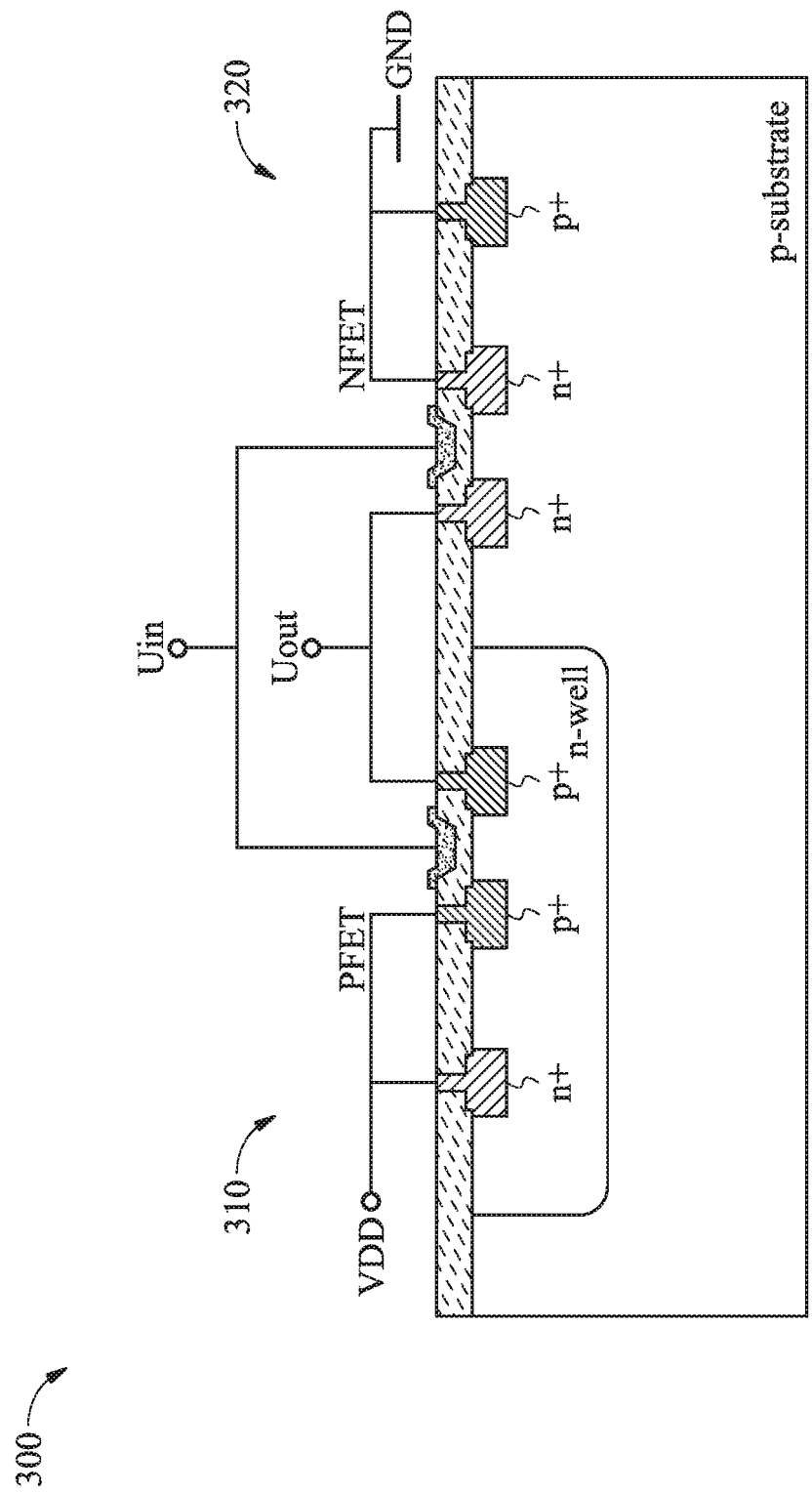
FIG. 15 is a schematic diagram of a complementary metal-oxide-semiconductor device, in accordance with some embodiments.

FIG. 15 is a schematic diagram of a complementary metal-oxide-semiconductor device 300, in accordance with some embodiments. The complementary metal-oxide-semiconductor device may be formed by the method 10 of FIG. 1 and/or by the method 200 of FIG. 8.

The complementary metal-oxide-semiconductor device includes a PFET device 310 and a NFET device 320. The PFET device 310 with the gradient doped region 160 has a channel resistance $R_{ch}$ lower than about 5.4 Kohm*fin and a parasitic resistance $R_p$ lower than about 7.1 Kohm*fin. In certain embodiments, the PFET device 310 has a channel resistance $R_{ch}$ in a range from about 1 Kohm*fin to about 5.0 Kohm*fin. In certain embodiments, the PFET device 310 has a parasitic resistance $R_p$ in a range from about 1 Kohm*fin to about 7.0 Kohm*fin. Lower channel resistance Rch and lower parasitic resistance Rp may help to reduced or prevent latch-up issues of the complementary metal-oxide-semiconductor device 300. Latch-up issues can occur when the current flows directly from positive supply voltage VDD to ground GND bypassing control by the gates of the PFET device 310 and the NFET device 320. Bypassing control by the gates of the PFET device 310 is believed to be caused by a high resistance of the fin structures 103A without a gradient dopant region. Current directly flowing from the positive supply voltage VDD to the ground GND can cause a short circuit condition and excessive current flows. The PFET device 310 with the gradient doped region 160 may be used to reduce or prevent latch-up issues without having to increase the size of isolation regions.

EXAMPLES

SiGe fins were formed over a substrate and recessed to formed recessed SiGe fins. In Example 1 and Example 2, gradient boron doped regions were formed over the recessed SiGe fins. Implantation was conducted at an implant energy in a range from about 1 KeV to about 5 KeV to form the gradient boron doped regions. In Example 1, the recessed fins were implanted with a dopant dose in a range from about $1 \times 10^{13}$ cm$^{-2}$ to about $5 \times 10^{13}$ cm$^{-2}$. In Example 2, the recessed SiGe fins were implanted with a dopant dose in a range from about $6 \times 10^{13}$ cm$^{-2}$ to about $1 \times 10^{14}$ cm$^{-2}$.

The properties of the recessed SiGe fins were measured and are summarized in TABLE 1. The ratio of the $I_{on}/I_{off}$ provides a measure of the speed of turning on and off an individual gate. $I_{on}$ is the on-state current. $I_{off}$ is the off-state leakage current. A higher $I_{on}/I_{off}$ ratio is a measure of higher performing semiconductor device. Example 1 and Example 2 in which gradient doped regions were formed over the recessed SiGe fins exhibited higher $I_{on}/I_{off}$ ratio than other devices. $I_{on}/I_{off}$ ratio is inversely proportional to the channel resistance $R_{ch}$ and to the parasitic resistance $R_p$. Parasitic resistance $R_p$ includes the gate resistance and source/drain resistance. Example 1 and Example 2 in which gradient doped regions were formed over the recessed SiGe fins exhibited lower channel resistance $R_{ch}$ and lower parasitic resistance $R_p$ than other devices.

TABLE 1

|  | Example 1 | Example 2 |
| --- | --- | --- |
| $I_{on}/I_{off}$ | 35% | 39% |
| $R_{ch}$ | 4.64 | 3.87 |
| $R_p$ | 6.89 | 6.32 |

In certain embodiments, the gradient doped regions 160, such as a gradient boron doped regions, can provide reduced channel resistance $R_{ch}$ and reduced parasitic resistance $R_p$. In certain embodiments, source/drain regions may be formed on the gradient doped regions 160, such as gradient boron doped regions, of a recessed fin in which the source/drain regions induce a strain in a channel defined by a gate formed over the fin.

In certain embodiments, the gradient doped regions 160 may be used in a complementary metal-oxide-semiconductor device. For example, the recessed fin structure 103, such as a recessed SiGe fin or a recessed Si fin, with gradient doped regions 160 may be used in a PFET device of complementary metal-oxide-semiconductor device.

It is understood that the semiconductor devices and methods of manufacture may also include additional layers, such as photoresist layers, mask layers, diffusion barrier layers, capping layers, silicide areas, etch stop layers, dielectric layers, adhesion layers, and the other suitable layers. The semiconductor devices and methods may also include additional manufacturing processes including photoresist coating (e.g., spin-on coating), soft baking, mask aligning, exposure, post-exposure baking, developing the photoresist, rinsing, drying, hard baking, inspection, etching, planarization, chemical mechanical polishing (CMP), wet clean, ashing, and/or other applicable processes.

It is understood that the p-type FET devices may also be integrated with the formation of n-type FET devices. It is understood that the substrate may include a plurality of layers (such as conductive layers, semiconductive layers, insulating layers) and/or features (doped regions or wells, fins, source/drain regions, isolation regions, shallow trench isolation (STI) feature, gate structures, interconnect lines, vias, and other suitable features) formed in, on, and/or over the substrate. The plurality of layers and/or features are used in the fabrication of semiconductor devices and integrated circuits. The substrate may also include additional materials formed in, on, and/or over the substrate in the operations of the methods and in the figures as described herein.

In certain embodiments, the operations of the method 10 and the method 200 may be performed in other orders. In certain embodiments, certain operations of the method 10 and the method 200 may be skipped. In certain embodiments, additional processes may be performed between the operations of the method 10 and the method 200.

An embodiment is a method of manufacturing a semiconductor device. The method includes forming a fin on a substrate. A gate structure is formed over the fin. A recess is formed in the fin proximate the gate structure. A gradient doped region is formed in the fin with a p-type dopant. The gradient doped region extends from a bottom surface of the recess to a vertical depth below the recess in the fin. A source/drain region is formed in the recess and on the gradient doped regions.

An embodiment is a semiconductor device including a p-type field effect transistor (PFET) structure. The PFET structure includes a fin on a substrate. A gate structure is over the fin. An epitaxial source/drain region is on the fin proximate the gate structure. A gradient doped region is in the fin extending from a bottom of the epitaxial source/drain region into the fin.

An embodiment is another method of manufacturing a semiconductor device. The method includes forming a first fin structure and a second fin structure on a substrate. A first gate structure is formed over the first fin structure and a second gate structure is formed over the second fin structure. A first recess is formed in the first fin structure proximate the first gate structure. A gradient doped region is formed in the first fin structure through the first recess. A second recess is formed in the second fin structure proximate the second gate structure. Respective source/drain regions are formed (i) in the first recess on the gradient doped region in the first fin structure and (ii) in the second recess in the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a fin on a substrate;
   forming a gate structure over the fin;
   forming a recess in the fin proximate the gate structure;
   forming a gradient doped region in the fin with a p-type dopant, wherein forming the gradient doped region comprises:
      implanting a bottom surface of the recess with the p-type dopant, wherein a first doped region extends from the bottom surface of the recess to a vertical depth below the recess in the fin; and
      implanting sidewalls of the recess with the p-type dopant, wherein a second doped region is formed on portions of the sidewalls extending from the sidewalls into the fin; and
   forming a source/drain region in the recess and on the gradient doped region.

2. The method of claim 1, wherein the fin comprises silicon or silicon germanium.

3. The method of claim 1, wherein the p-type dopant is a boron dopant implanted to a peak concentration in the gradient doped region in a range from about $1 \times 10^{13}$ cm$^{-3}$ to about $1 \times 10^{14}$ cm$^{-3}$.

4. The method of claim 1, wherein the gradient doped region has a bottom portion, a middle portion, and a top portion.

5. The method of claim 1, wherein the p-type dopant is implanted with an ion beam energy in a range of from about 1 KeV to about 15 KeV.

6. The method of claim 1, wherein the source/drain region comprises doped silicon germanium.

7. The method of claim 1, wherein the source/drain region induces a strain in a channel of the fin defined by the gate structure.

8. A method of manufacturing a semiconductor device, the method comprising:
   forming a first fin structure and a second fin structure on a substrate;
   forming a first gate structure over the first fin structure and a second gate structure over the second fin structure;
   forming a first recess in the first fin structure proximate the first gate structure;
   forming a gradient doped region in the first fin structure through the first recess, wherein forming the gradient doped region comprises:

doping a bottom surface of the first recess, wherein a first doped region extends from the bottom surface of the first recess to a vertical depth below the first recess in the first fin structure; and doping sidewalls of the first recess to form a second doped region on portions of the sidewalls, the second doped region extending from sidewalls of the first recess into the first fin structure;

forming a second recess in the second fin structure proximate the second gate structure; and forming respective epitaxial source/drain regions (i) in the first recess on the gradient doped region in the first fin structure and (ii) in the second recess in the second fin structure.

9. The method of claim 8, wherein the second fin structure is implant-free when the respective epitaxial source/drain regions are formed.

10. The method of claim 8, wherein the gradient doped region is formed by implanting a p-type dopant to a concentration in a range from about $1\times10^{13}$ $cm^{-3}$ to about $1\times10^{14}$ $cm^{-3}$.

11. The method of claim 8, the first recess in the first fin structure and the second recess in the second fin structure are formed in separate processes.

12. A method of manufacturing a semiconductor device, the method comprising:

forming a fin on a substrate;

forming a gate structure over the fin;

forming a recess in the fin proximate the gate structure;

forming a gradient doped region in the fin with a p-type dopant, wherein forming the gradient doped region comprises:

performing a first ion implantation on a bottom surface of the recess with the p-type dopant, wherein a first doped region extends from the bottom surface of the recess to a vertical depth below the recess in the fin; and performing a second ion implantation on sidewalls of the recess with the p-type dopant, wherein a second doped region extends from the sidewalls into the fin, wherein a first dopant concentration along sidewalls of the recess is less than a second dopant concentration along a bottom of the recess;

after forming the gradient doped region, epitaxially growing a semiconductor material in the recess; and forming a source/drain region in the gradient doped region.

13. The method of claim 12, wherein a third dopant concentration along an uppermost portion of the sidewalls is less than the first dopant concentration.

14. The method of claim 12, wherein the first dopant concentration is in a range from about $5\times10^{18}$ $cm^{-3}$ to about $5\times10^{20}$ $cm^{-3}$.

15. The method of claim 14, wherein the second dopant concentration is in a range from about $1\times10^{19}$ $cm^{-3}$ to about $1\times10^{21}$ $cm^{-3}$.

16. The method of claim 15, wherein the third dopant concentration is in a range from about $1\times10^{18}$ $cm^{-3}$ to about $1\times10^{20}$ $cm^{-3}$.

17. The method of claim 16, wherein the first dopant concentration has a depth from about 3 nm to about 15 nm.

18. The method of claim 17, wherein the second dopant concentration has a depth from about 5 nm to about 20 nm.

19. The method of claim 18, wherein the third dopant concentration has a depth from about 1 nm to about 10 nm.

20. The method of claim 19, wherein the semiconductor material comprises p-type doped silicon germanium.

* * * * *